(12) United States Patent
Funakoshi et al.

(10) Patent No.: US 8,389,116 B2
(45) Date of Patent: Mar. 5, 2013

(54) PHOTOSENSITIVE RESIN COMPOSITION

(75) Inventors: Shinji Funakoshi, Tokyo (JP); Koshi Okita, Tokyo (JP); Hiroshi Yamada, Tokyo (JP); Kei Tomeba, Tokyo (JP)

(73) Assignee: Asahi Kasei Chemicals Corporation, Tokyo (JP)

( * ) Notice: Subject to any disclaimer, the term of this patent is extended or adjusted under 35 U.S.C. 154(b) by 1000 days.

(21) Appl. No.: 12/440,155

(22) PCT Filed: Sep. 4, 2007

(86) PCT No.: PCT/JP2007/067160
§ 371 (c)(1),
(2), (4) Date: Mar. 5, 2009

(87) PCT Pub. No.: WO2008/029777
PCT Pub. Date: Mar. 13, 2008

(65) Prior Publication Data
US 2010/0189941 A1    Jul. 29, 2010

(30) Foreign Application Priority Data

Sep. 6, 2006 (JP) ................................ 2006-241170
Jul. 2, 2007 (JP) ................................ 2007-173864

(51) Int. Cl.
*B32B 17/10*    (2006.01)

(52) U.S. Cl. ..... 428/339; 428/332; 428/402; 430/270.1; 430/286.1; 430/289.1; 430/306

(58) Field of Classification Search .................. 428/332, 428/339, 402; 430/270.1, 286.1, 289.1, 306
See application file for complete search history.

(56) References Cited

U.S. PATENT DOCUMENTS

| | | | |
|---|---|---|---|
| 5,627,287 A | 5/1997 | Sasaki et al. | |
| 5,798,202 A | 8/1998 | Cushner et al. | |
| 6,410,613 B1 | 6/2002 | Ohnishi et al. | |
| 6,935,236 B2 | 8/2005 | Hiller et al. | |
| 7,029,835 B2 | 4/2006 | Goswami et al. | |
| 2002/0068778 A1 | 6/2002 | Ohnishi et al. | |
| 2004/0089180 A1 | 5/2004 | Hiller et al. | |
| 2004/0157162 A1 | 8/2004 | Yokota et al. | |

FOREIGN PATENT DOCUMENTS

| | | |
|---|---|---|
| EP | 1 795 964 A2 | 6/2007 |
| JP | 06-345820 | 12/1994 |
| JP | 2846954 | 10/1998 |
| JP | 3271226 | 1/2002 |
| JP | 2004-262135 | 9/2004 |
| JP | 2004-533343 | 11/2004 |
| JP | 2005-43660 | 2/2005 |
| JP | 2006-69120 | 3/2006 |
| JP | 3801592 | 5/2006 |
| JP | 2006-248191 | 9/2006 |
| WO | WO 99/10354 | 3/1999 |

OTHER PUBLICATIONS

Supplementary European Search Report dated Mar. 14, 2011 issued in correspondence European Application No. 07806628.9.
Fujimoto; "Shin Kaimen-Kasseizai Nyumon (Introduction to Surfactants (New Version) Revised Edition))", Table 2-5-1. Classification of Non-Ionic Surfactants, Sanyo Chemical Industries, Ltd. (publisher), p. 92, (1985).
Office Action dated Jul. 5, 2011 issued in corresponding Japanese patent application.

*Primary Examiner* — Michael C Miggins
(74) *Attorney, Agent, or Firm* — Finnegan, Henderson, Farabow, Garrett & Dunner, L.L.P.

(57) ABSTRACT

Problem to be Solved
To provide a photosensitive resin composition which has good processability even in a relatively low temperature condition near room temperature and exhibits good efficiency in removing debris generated while shaping a printing plate by laser engraving.
Solution
A photosensitive resin composition, characterized by comprising: (a) 100 parts by mass of a resin having a number average molecular weight of 1,000 or more; and (b) 0.1 to 10 parts by mass of ultrafine particles having a number average particle diameter of primary particles of 5 nm or more and 100 nm or less; wherein the photosensitive resin composition has a viscosity at 20° C. of 50 Pa·s or more and 10,000 Pa·s or less; and a precursor composition, which is obtained by excluding the component (b) from the photosensitive resin composition, has a viscosity at 20° C. of 5 Pa·s or more and 500 Pa·s or less.

10 Claims, No Drawings

US 8,389,116 B2

PHOTOSENSITIVE RESIN COMPOSITION

TECHNICAL FIELD

The present invention relates to a photosensitive resin composition which has good processability even in a relatively low temperature condition near room temperature and exhibits good efficiency in removing debris generated while shaping a printing plate by laser engraving, a printing substrate obtained by using the photosensitive resin composition, a printing plate obtained by using the printing substrate, and a method for producing the printing plate.

BACKGROUND ART

In recent years, laser engraving technology to form a pattern on a surface using a laser is spreading in the fields such as flexographic printing, dry offset, and embossing. According to the technology, a resin in a portion irradiated with a laser is melted or removed by decomposition to form a relief pattern.

Laser engraving of a rubber material has conventionally been performed. However, there was a case where powdered debris fused to the edge of a laser engraved pattern and it could not be removed completely. In such a case, the quality of the resulting printed matter was not satisfactory in that the part to which the debris was adhered was printed in the printing step.

Afterwards, a material obtained by photocuring a photosensitive resin was developed, and improvement in printing quality has been observed. For example, Patent Document 1 (Japanese Patent No. 2846954) describes a composition in which polymerizable monomers and a reinforcing material such as carbon black are added in a thermoplastic elastomer material.

Further, Patent Document 2 (Japanese Patent No. 3801592) describes a material obtained by photocuring a liquid photosensitive resin containing inorganic porous particles. This patent document describes obtaining a printing element using the material and a method of applying laser engraving to the printing element. This patent document also describes that the efficiency in removing liquid debris generated during laser engraving is improved by adding an inorganic porous material.

Further, Patent Document 3 (National Publication of International Patent Application No. 2004-533343) describes a composition comprising a photosensitive resin using a thermoplastic elastomer as a main raw material and a filler having a particle diameter of from 1 to 400 nm.
[Patent document 1] Japanese Patent No. 2846954
[Patent Document 2] Japanese Patent No. 3801592
[Patent Document 3] National Publication of International Patent Application No. 2004-533343

DISCLOSURE OF THE INVENTION

Problems to be Solved by the Invention

However, Patent Document 1 describes nothing about the relation between the efficiency in removing debris in the laser engraving step and a reinforcing material. Further, although the content of carbon black used in an example of this patent document is a very low level of about 0.2% by mass, the ultraviolet transmittance is reduced and the photocurability of the composition is not sufficient since carbon black has strong light absorption properties in an ultraviolet wavelength region. As a result, there was still room for the improvement from the viewpoint of sufficiently removing liquid engraving debris generated in a large amount during laser engraving. Further, in order to shape a composition described in Patent Document 1 into a sheet, the composition needs to be heated to high temperatures. Therefore, an expensive and complicated extruder may be needed depending on the case. Extrusion is very difficult in a low temperature condition near room temperature.

In the method described in Patent Document 2, there was a case where the viscosity of a liquid photosensitive resin composition significantly increased and had a problem in shapability when ultrafine particles of less than 100 nm were added. Further, in an example of this patent document, microparticles having a number average particle diameter of about 3 μm are used. However, there was still room for the improvement from the viewpoint of securing pattern accuracy because, when a precise pattern of about 5 μm was formed, the microparticles were present overflowing the pattern.

Further, Patent Document 3 describes nothing about the efficiency in removing liquid engraving debris generated during laser engraving. The composition used in this patent document comprises a thermoplastic elastomer as a main component. Therefore, in order to shape this composition into a sheet, the composition needs to be heated to a high temperature exceeding 100° C., and an expensive and complicated extruder may be needed depending on the case. Further, in this patent document, a fine filler is mixed and the viscosity of the composition in a molten state is relatively high. When the composition is heated to higher temperatures from a viewpoint of securing shapability, there was a case where the composition gelled in the extruder, causing poor quality.

That is, in the prior art, there was no photosensitive resin composition whose viscosity can be maintained in a range where the composition can be shaped at a relatively low temperature near room temperature, even when ultrafine particles having a very small particle diameter was contained therein.

Further, Patent Document 1 describes a laser engraving process for forming a relief pattern by directly irradiating the surface of a resin plate with a laser beam to remove the resin portion irradiated with the laser beam. However, when the carbon dioxide laser is used, it is difficult to form a high definition pattern. The oscillation wavelength of the carbon dioxide laser is about 10 μm. Therefore, it is difficult to reduce the diameter of a laser beam to 20 μm or less. Patent Document 1 describes that, for forming a higher definition pattern, a photosensitive resin cured product obtained by mixing carbon black therein and subjecting it to photocuring is irradiated with the fundamental wave (wavelength: 1.06 μm) of a YAG laser which is a near-infrared laser to form a pattern. It becomes possible to reduce the diameter of a laser beam by using a shorter oscillation wavelength of a laser used for engraving.

However, a device is required to enable engraving using such a near-infrared laser. Since a common organic compound does not have strong light absorption in a near-infrared region, it is necessary to mix a dye or a pigment having strong light absorption properties in this wavelength region with the photosensitive resin composition so that it absorbs the light of a near-infrared laser. Also in Patent Document 1, a black pigment, carbon black, is mixed with a photosensitive resin composition as a near-infrared absorber. However, a near-infrared absorbing material including such a black pigment generally exhibits strong light absorption properties also in an ultraviolet region. As a result, when performing photocuring of the photosensitive resin composition using ultraviolet light, the curability thereof tends to be extremely reduced. That is, in the photosensitive resin composition containing a near-infrared absorbing material, it was a very difficult subject to secure both the efficiency in laser engraving and mechanical properties. Further, it was a very difficult problem to obtain a photosensitive resin cured product which can be engraved using both a near-infrared laser and an infrared laser and can secure both mechanical properties.

In the prior art, a continuous wave near-infrared laser and a pulsed near-infrared laser having a small highest peak output are used as a light source for engraving. However, in the case of engraving a material having low light absorption properties, that is, high light transmittance, in the oscillation wavelength of these light sources, the energy of these light sources was insufficient and desired engraving was difficult.

On the other hand, when a continuous wave near-infrared laser having a large average output or a pulsed near-infrared laser having an excessively large highest peak output is used, the energy supplied to a material to be engraved is large, causing a large influence to the material including melting thereof by heat. As a result, formation of a precise pattern was also difficult due to formation of a concave portion having a size largely exceeding the diameter of a laser beam or occurrence of a sag in a pattern edge part.

That is, in the prior art, there was no laser engraving technique which enabled formation of a precise pattern (in particular, a precise pattern having a width of 20 μm or less) on the surface of a resin printing element.

An object of the present invention is to provide to a photosensitive resin composition which has good processability even in a relatively low temperature condition near room temperature and exhibits good efficiency in removing debris generated while shaping a printing plate by laser engraving, a printing substrate obtained by using the photosensitive resin composition, a printing plate obtained by using the printing substrate, and a method for producing the printing plate.

Means for Solving the Problems

As a result of extensive and intensive studies, the present inventors have found that, when a photosensitive resin composition is prepared, the viscosity of the photosensitive resin composition can be controlled within a specific range to thereby secure shapability even if an appropriate amount of ultrafine particles are contained, and it is possible to obtain a printing substrate whose efficiency in removing debris at the time of laser engraving is improved, by using a specific resin, and by setting the viscosity (20° C.) of a precursor composition before blending the ultrafine particles to a value within a specific range. The present invention has been completed on the basis of these findings.

Specifically, the present invention is as follows.

[1]
A photosensitive resin composition, characterized by comprising:
(a) 100 parts by mass of a resin having a number average molecular weight of 1,000 or more; and
(b) 0.1 to 10 parts by mass of ultrafine particles having a number average particle diameter of primary particles of 5 nm or more and 100 nm or less; wherein the photosensitive resin composition has a viscosity at 20° C. of 50 Pa·s or more and 10,000 Pa·s or less; and a precursor composition, which is obtained by excluding the component (b) from the photosensitive resin composition, has a viscosity at 20° C. of 5 Pa·s or more and 500 Pa·s or less.

[2]
The photosensitive resin composition according to [1], further comprising: (c) 5 to 200 parts by mass of an organic compound which has a number average molecular weight of 100 or more and less than 1,000 and has a polymerizable unsaturated group in the molecule thereof.

[3]
The photosensitive resin composition according to [1] or [2], wherein the component (b) is a nonporous ultrafine particle produced by any of flame hydrolysis, an arc process, a plasma process, a precipitation method, a gelling method, or a fused solid method; and the nonporous ultrafine particle is a nonporous particle composed, as a main component, of at least one selected from the group consisting of alumina, silica, zirconium oxide, barium titanate, strontium titanate, titanium oxide, silicon nitride, boron nitride, silicon carbide, chrome oxide, vanadium oxide, tin oxide, chrome oxide, vanadium oxide, tin oxide, bismuth oxide, germanium oxide, aluminum borate, nickel oxide, molybdenum oxide, tungsten oxide, iron oxide, and cerium oxide.

[4]
The photosensitive resin composition according to any one of [1] to [3], wherein the primary particles of the component (b) each have a spherical shape.

[5]
The photosensitive resin composition according to any one of [1] to [4], wherein the component (b) is hydrophilic.

[6]
The photosensitive resin composition according to any one of [1] to [5], wherein the component (a) has a hydrogen-bonding functional group in the molecule thereof.

[7]
The photosensitive resin composition according to any one of [1] to [6], wherein the component (a) has at least one bond selected from the group consisting of a carbonate bond, an amide bond, an ester bond, and an imide bond; or the component (a) has at least one molecular chain selected from the group consisting of an aliphatic hydrocarbon chain and an alicyclic hydrocarbon chain and has a urethane bond.

[8]
The photosensitive resin composition according to any one of [1] to [7], wherein the component (b) has a specific surface area of 10 m$^2$/g or more and 1,000 m$^2$/g or less.

[9]
The photosensitive resin composition according to any one of [1] to [8], wherein the composition has thixotropy.

[10]
The photosensitive resin composition according to any one of [1] to [8], wherein the component (b) is micro-dispersed in the component (c), wherein the micro-dispersion treatment is at least one method selected from the group consisting of an ultrasonic dispersion method, a high-speed agitation and dispersion method, a high-speed shear dispersion method, and a bead mill dispersion method.

[11]
The photosensitive resin composition according to any one of [1] to [10], further comprising: (d) 0.01 to 5 parts by mass of a nonionic surfactant having a hydrogen-bonding functional group.

[12]
A laser engravable printing substrate characterized by comprising: a support and a photosensitive resin cured product layer provided on the support which is formed from a photosensitive resin composition according to any one of [1] to [11], wherein the photosensitive resin cured product layer has a thickness of 0.05 mm or more and 100 mm or less.

[13]
The printing substrate according to [12], wherein the support has a hollow cylindrical shape.

[14]
The printing substrate according to [13], wherein the support comprises at least one selected from the group consisting of a fiber reinforced plastic, a film reinforced plastic, and metal as a main component.

[15]
The printing substrate according to [12], [13], or [14], wherein the printing substrate comprises a resin layer having cushioning properties between the photosensitive resin cured product layer and the support.

[16]
The printing substrate according to any one of [12] to [15], wherein the photosensitive resin cured product layer is light absorptive for near-infrared rays in a region from the surface thereof to a depth of at least 50 μm.

[17]
The printing substrate according to any one of [12] to [15], wherein the photosensitive resin cured product layer in a region from the surface to a depth of 50 has a laser beam transmittance of 20% or more and 95% or less.

[18]
A printing plate, characterized by comprising a relief pattern formed on the surface of the printing substrate according to any one of [12] to [17].

[19]
A method for producing a printing plate according to [18], characterized by comprising a laser engraving step of forming a relief pattern on the surface of the printing substrate by a pulsed near-infrared laser beam, wherein the average light source output of the pulsed near-infrared laser beam is 0.01 W or more and less than 5 W.

[20]
The method for producing a printing plate according to [19], wherein the pulse width of the pulsed near-infrared laser beam is 1 femtosecond or more and 200 nanoseconds or less.

[21]
The method for producing a printing plate according to [19] or [20], wherein the beam diameter of the pulsed near-infrared laser beam is condensed to 1 μm or more and less than 20 μm in the laser engraving step.

[22]
The method for producing a printing plate according to any one of [19] to [21], wherein the laser engraving step comprises forming a relief pattern on the surface of the printing substrate with an infrared laser beam having a beam diameter of 15 μm or more and less than 100 μm.

[23]
The method for producing a printing plate according to [22], wherein the oscillation wavelength of the infrared laser beam is 700 nm or more and 3 μm or less, and the oscillation wavelength of the pulsed near-infrared laser beam is 5 μm or more and 20 μm or less.

[24]
The method for producing a printing plate according to [22] or [23], wherein the number of beams of the pulsed near-infrared laser beam and the number of beams of the infrared laser beam are at least one, respectively.

[25]
The method for producing a printing plate according to any one of [19] to [24], wherein the laser engraving step comprises: rotating a cylinder in the peripheral direction thereof, the cylinder having the printing substrate fixed on the peripheral surface thereof, and sweeping a laser beam across the rotating cylinder in the longitudinal axis direction thereof or scanning the laser beam in the longitudinal axis direction of the rotating cylinder using a galvanomirror, thereby forming a relief pattern on the surface of the printing substrate.

[26]
The method for producing a printing plate according to any one of [19] to [25], wherein the power per pulse of the pulsed near-infrared laser beam is 10 W or more and 20 kW or less, and the repetition frequency of the pulsed near-infrared laser beam is 20 Hz or more and 500 MHz or less.

[27]
The method for producing a printing plate according to any one of [19] to [26], wherein the pulsed near-infrared laser beam is the fundamental wave of a semiconductor laser end-pumped solid state laser or a fiber laser.

[28]
The method for producing a printing plate according to any one of [19] to [27], wherein the depth of the relief pattern formed by one pulse of the pulsed near-infrared laser beam is 0.05 μm or more and 10 μm or less.

Advantages of the Invention

The present invention can provide a laser engravable photosensitive resin composition in which the efficiency in removing debris generated at the time of laser engraving is improved and which can be easily shaped.

BEST MODE FOR CARRYING OUT THE INVENTION

Hereinafter, the best mode (hereinafter, "embodiment") for carrying out the present invention will be described in detail. Note that the present invention is not limited to the following embodiments and can be performed by variously modifying them within the range of the gist of the present invention.

A laser engravable photosensitive resin composition (may also be written as "a photosensitive material for laser engraving", or "a photosensitive material for a laser engravable printing substrate") of the present embodiment comprises the following components (a) and (b):
(a) a resin having a number average molecular weight of 1,000 or more; and (b) ultrafine particles having a number average particle diameter of primary particles of 5 nm or more and 100 nm or less.

In the present embodiment, removal of the debris generated at the time of laser engraving is improved by comprising the above component (b).

Further, the photosensitive resin composition of the present embodiment preferably comprises the following component:
(c) an organic compound which has a number average molecular weight of 100 or more and 1,000 or less and has a polymerizable unsaturated group in the molecule thereof.

In the present embodiment, using the component (a) having a specific number average molecular weight (1,000 or more) and the component (c) having a specific number average molecular weight (100 or more and 1,000 or less) in combination can contribute to the coexistence of good shapability of the photosensitive resin composition and good efficiency in removing debris generated at the time of laser engraving. The mechanism of the above result may be explained as follows, details thereof being not known: Blending both of the above components can contribute to the processing suitability (suitable flowability) of the photosensitive resin composition when a specific amount of the component (b) is blended therewith. Further, blending of the component (a) and the component (c) will suitably adjust the density of the crosslinking points when the photosensitive resin composition is cured to thereby generate, at the time of laser engraving, debris in a state suitable for removal.

In the present embodiment, the component (a) has a number average molecular weight of 1,000 or more. The component (a) preferably has a number average molecular weight of 1,000 or more and 200,000 or less, more preferably 2,000 or more and 100,000 or less, further preferably 5,000 or more and 50,000 or less. It is suitable that the component (a) have a number average molecular weight of 1,000 or more in terms of maintaining the strength of a photosensitive resin cured product to be prepared by crosslinking and securing the repeated durability thereof when it is used as a substrate for printing or the like. Further, the upper limit of the number average molecular weight of the component (a) is preferably 200,000 or less. The upper limit of the number average molecular weight of the component (a) of 200,000 or less is suitable in that the viscosity of the photosensitive resin composition is not excessively increased, and it is not necessary to use a complicated processing method such as heating extrusion when producing a sheet shaped or cylindrical photosensitive resin cured product.

Note that the number average molecular weight described in the present embodiment has been measured using gel permeation chromatography, calibrated with a polystyrene having a known molecular weight, and expressed in terms of the polystyrene.

In addition, the component (a) is preferably liquid at 20° C. from a viewpoint of pro cessability.

Examples of the component (a) include polyolefines such as a polyethylene and a polypropylene; hydrocarbons such as a polybutadiene, a hydrogenated polybutadiene, a polyisoprene, and a hydrogenated polyisoprene; polyesters such as an adipate and a polycaprolactone; polyethers such as a polyethylene glycol, a polypropylene glycol, a polyoxyethylene-polyoxypropylene block copolymer, and a polytetramethylene glycol; polycarbonates such as an aliphatic polycarbonate and a polycarbonate diol; silicones such as a polydimethylsiloxane; polymers of (meth)acrylic acid and/or derivatives thereof; polyhaloolefins such as a polyvinyl chloride and a polyvinylidene chloride; a polystyrene, a polyacrylonitrile, a polyvinyl alcohol, a polyvinyl acetate, a polyvinyl acetal, a polyacrylic acid, a poly(meth)acrylic ester, a poly(meth)acrylamide, a polyacetal, a polyurethane, a polyamide, a polyurea and a polyimide. Each of these polymers may be used alone or may be used in combination. Alternatively, a copolymer may be used suitably.

Especially, in the light of an object of the present embodiment, it is suitable that the component (a) include a polyether from the viewpoint of adjusting the viscosity (at 20° C.) of the photosensitive resin composition to be obtained within a specific range.

Further, in the light of an object of the present embodiment, it is suitable that the component (a) include a polycarbonate from the viewpoint of adjusting the thixotropy of the photosensitive resin composition to be obtained within a specific range.

The component (a) is preferably a resin having a polymerizable unsaturated group in the molecule thereof from the viewpoint of securing mechanical properties of printing plates to be obtained. As a particularly desirable compound, a polymer having 0.7 or more polymerizable unsaturated groups on an average per molecule can be mentioned. It is suitable to design a polymer having 0.7 or more of polymerizable unsaturated groups on an average per molecule from the viewpoint of realizing good mechanical strength of a photosensitive resin cured product obtained from the photosensitive resin composition of the present embodiment and realizing a printing plate having good durability such that it withstands repeated use as a substrate for printing. When the mechanical strength of a photosensitive resin cured product is taken into consideration, the number of the polymerizable unsaturated groups of the component (a) is preferably 0.7 or more per molecule, and it more preferably exceeds 1 per molecule. The upper limit of the number of the polymerizable unsaturated groups per molecule is not particularly limited, but it is 20 or less as a desirable range. It is suitable to design a polymer having 20 or less of polymerizable unsaturated groups from the viewpoint of reducing the shrinkage when the photosensitive resin composition is crosslinked and cured and suppressing the generation of cracks or the like near the surface.

Note that, in the present embodiment, the term "in the molecule" includes any case where a polymerizable unsaturated group is directly attached to an atom at an end of a polymer main chain, at an end of a polymer side chain, in a polymer main chain, or in a polymer side chain. Further, a polymerizable unsaturated group refers to a polymerizable functional group which participates in a free radical or addition polymerization reaction.

As a method for introducing a polymerizable unsaturated group into a compound which constitutes the component (a), a method for directly introducing the polymerizable unsaturated group into the molecular end or the molecular chain thereof may be used. Alternatively, a method for indirectly introducing the polymerizable unsaturated group via a different molecular chain may be used. For example, the following method can be mentioned as a method for indirectly introducing the polymerizable unsaturated group. First, a compound having a plurality of reactive groups, such as a hydroxyl group, an amino group, an epoxy group, a carboxyl group, an acid anhydride group, a ketone group, a hydrazine residue, an isocyanate group, an isothiocyanate group, a cyclic carbonate group and an ester group, is allowed to react with a binding compound having a plurality of functional groups capable of binding with the reactive groups (for example, a polyisocyanate can be used as the binding compound when the reactive group is a hydroxyl group or an amino group), to thereby adjust the molecular weight and convert the terminals into binding groups. Subsequently, a compound having a polymerizable unsaturated group and a functional group which reacts with the terminal binding groups of the reactive compound is allowed to react with the reactive compound obtained in the above reaction to thereby introduce the polymerizable unsaturated group into the terminals. A polymerizable unsaturated group can be introduced by such a method.

With respect to the component (a), particularly in consideration of the case where a flexible relief image is required like in a flexographic printing application, the component (a) may also comprises a liquid resin having a glass transition temperature of 20° C. or less, more preferably a liquid resin having a glass transition temperature of 0° C. or less.

Examples of such a liquid resin include polyolefines such as a polyethylene and a polypropylene; hydrocarbons such as a polybutadiene, a hydrogenated polybutadiene, a polyisoprene, and a hydrogenated polyisoprene; polyesters such as an adipate and a polycaprolactone; polyethers such as a polyethylene glycol, a polypropylene glycol, a polyoxyethylene-polyoxypropylene block copolymer, and a polytetramethylene glycol; polycarbonates such as an aliphatic polycarbonate; silicones such as a polydimethylsiloxane; polymers of (meth)acrylic acid and/or derivatives thereof; polyhaloolefins such as a polyvinyl chloride and a polyvinylidene chloride; unsaturated polyurethanes having a polycarbonate structure; a polystyrene, a polyacrylonitrile, a polyvinyl alcohol, a polyvinyl acetate, a polyvinyl acetal, a polyacrylic acid, a poly(meth)acrylic ester, a poly(meth)acrylamide, a polyacetal, a polyamide, a polyurea and a polyimide. Each of these polymers may be used alone or may be used in combination. Alternatively, a copolymer may be used suitably.

The content of the liquid resin in the component (a) is preferably 30% by mass or more and 100% by mass or less. It is preferred to use unsaturated polyurethanes having a polycarbonate structure as the liquid resin particularly from the viewpoint of weather resistance.

In some cases, an ink used in printing may be a solvent-based ink (particularly, an ink containing a nitrogen-containing compound such as an ester compound such as ethyl acetate, propyl acetate and butyl acetate, and n-methylpyrrolidone, in an amount of 10% by volume or more of the solvent component). In such a case, from the viewpoint of allowing a printing plate to exhibit good resistance to an ink, the component (a) is preferably a compound having at least one bond selected from the group consisting of a carbonate bond, an amide bond, an ester bond, and an imide bond; or a compound having at least one molecular chain selected from the group consisting of an aliphatic hydrocarbon chain and an alicyclic hydrocarbon chain and having a urethane bond.

When the photosensitive resin cured product of the present embodiment is used as a printing substrate for laser engraving, it is preferred to use a compound having high thermal decomposability as the component (a). For example, a compound having α-methyl styrene, a methacrylate, an acrylate, a carbonate bond, a carbamate bond, or the like in the molecule thereof can be used as a compound having high thermal decomposability. As an index of thermal decomposability, there can be used data from the thermogravimetric analysis measuring the weight loss at the time of heating a sample in an inert gas atmosphere.

As a preferred resin from the above viewpoint, there can be mentioned a resin in which the temperature where it loses half of its weight is in the range of 150° C. or higher and 450° C. or less. The temperature range is more preferably 250° C. or higher and 400° C. or less, further preferably 250° C. or higher and 380° C. or less. Further, a compound is preferred in which the thermal decomposition occurs in a narrow temperature range. A difference between the temperature where the weight reaches 80% of the initial weight and the temperature where the weight reaches 20% of the initial weight in the thermogravimetric analysis can be used as an index of the temperature range of the thermal decomposition. The difference is preferably 100° C. or less, more preferably 80° C. or less, further preferably 60° C. or less.

The component (a) preferably has a hydrogen-bonding functional group in the molecule thereof from the viewpoint of securing compatibility with the component (b). The hydrogen-bonding functional group includes functional groups such as an alcoholic hydroxyl group, a phenolic hydroxyl group, an amino group, a carbonyl group, and a carboxyl group, as well as structures such as an amide bond, an ester bond, a carbonate bond, a urethane bond, an imide bond, and an ether bond. Since such a hydrogen-bonding functional group has strong interaction with a hydroxyl group present on the surface of inorganic ultrafine particles, it is effective in maintaining the inorganic ultrafine particles in a stable state for a long period of time. The compatibility of the hydrogen-bonding functional group of the component (a) with the component (b) can also contribute to the thixotropy of the photosensitive resin composition, which can contribute to the improvement in shapability of the photosensitive resin composition.

Presence of the hydrogen-bonding functional group can be clarified by conducting $^1$H-NMR analysis (nuclear magnetic resonance spectroscopy). Further, it is preferred that 10% or more and 99% or less of hydrogen atoms have chemical shift peaks in the ranges of from 4.0 to 4.3 ppm and from 4.5 to 6.5 ppm with respect to tetramethylsilane (TMS) based on all the hydrogen atoms contained in the component (a). In $^1$H-NMR, a functional group structure present in the surroundings of the hydrogen atoms having a chemical shift peak in the range of from 4.0 to 4.3 ppm includes a carbonate bond, an ester bond, an amide bond, a urethane bond, and a urea skeleton. Further, a structure of the hydrogen atoms having a chemical shift peak in the range of 4.5 to 6.5 ppm includes hydrogen atoms directly bonded to double bond carbons or aromatic carbons. The presence ratio of the hydrogen atoms having peaks in the chemical shift ranges as described above is preferably 10% or more and 60% or less, more preferably 20% or more and 60% or less, further preferably 30% or more and 50% or less, of all the hydrogen atoms which constitute the component (a). The presence ratio is computable from the integral values determined in the $^1$H-NMR measurement. The presence ratio of the hydrogen atoms in the range of 10% or more and 60% or less is suitable because it can sufficiently provide solvent resistance to an ester solvent or solvent resistance to an ink containing a hydrocarbon solvent used in dry offset and can also provide mechanical strength.

The component (c) is an organic compound which has a number average molecular weight of 100 or more and less than 1,000 and has a polymerizable unsaturated group. The component (c) preferably has a number average molecular weight of less than 1,000 from the viewpoint of easily diluting the component (a). On the other hand, it preferably has a number average molecular weight of 100 or more from the viewpoint of securing nonvolatility. The number average molecular weight is more preferably 200 or more and 800 or less.

Specific examples of the component (c) as a radically reactive compound include olefins such as ethylene, propylene, styrene and divinylbenzene, acetylenes, (meth)acrylic acid and derivatives thereof, haloolefins, unsaturated nitriles such as acrylonitrile, (meth)acrylamide and derivatives thereof, unsaturated dicarboxylic acids such as maleic anhydride, maleic acid and fumaric acid and derivatives thereof, vinyl acetates, N-vinyl pyrrolidone, and N-vinylcarbazole.

Especially, (meth)acrylic acid and derivatives thereof are preferred from the viewpoint of the abundance of the types thereof, a price, the decomposability at the time of laser beam irradiation, and the like. Examples of the derivatives include alicyclic compounds having a cycloalkyl group, a bicycloalkyl group, a cycloalkenyl group, a bicycloalkenyl group or the like, aromatic compounds having a benzyl group, a phenyl group, a phenoxy group, a naphthalene skeleton, an anthracene skeleton, a biphenyl skeleton, a phenanthrene skeleton, a fluorene skeleton or the like, compounds having an alkyl group, an alkyl halide group, an alkoxyalkyl group, a hydroxyalkyl group, an aminoalkyl group, a glycidyl group or the like, ester compounds with a polyhydric alcohol such as an alkylene glycol, a polyoxyalkylene glycol, a polyalkylene glycol or a trimethylolpropane, compounds having a polysiloxane structure such as a polydimethylsiloxane or a polydiethylsiloxane. The derivatives may include a heteroaromatic compound containing an element such as nitrogen or sulfur.

Further, specific examples of the component (c) as an addition-polymerizable compound (for example, a compound having an addition-polymerizable epoxy group) include compounds obtained by allowing epichlorohydrin to react with various polyols such as diol and triol and epoxy compounds obtained by allowing a peroxy acid to react with an ethylenic linkage in the molecule.

Specific examples include ethylene glycol diglycidyl ether, diethylene glycol diglycidyl ether, triethylene glycol diglycidyl ether, tetraethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerol diglycidyl ether, glycerol triglycidyl ether, trimethylolpropane triglycidyl ether, bisphenol A diglycidyl ether, a hydrogenated bisphenol A diglycidyl ether, a diglycidyl ether of a compound in which ethylene oxide or propylene oxide is added to bisphenol A, polytetramethylene glycol diglycidyl ether, poly(propylene glycol adipate)diol diglycidyl ether, poly(ethylene glycol adipate)diol diglycidyl ether, an epoxy compound obtained by epoxidizing poly(caprolactone)diol diglycidyl ether or the like, and an epoxy-modified silicone oil (for example, "HF-105" (tradename) or the like manufactured by Shin-Etsu Chemical Co., Ltd.).

In the present embodiment, one or more of the component (c) can be selected depending on an object of the embodiment. Especially, the component (c) preferably comprises at least one or more derivatives of long-chain aliphatics, alicyclics, or aromatics from the viewpoint of reducing swelling of the printing plate in a solvent (such as an organic solvent such as an alcohol or an ester) of printing ink. Further, the component (c) preferably comprises at least one or more compounds having alicyclic or aromatic substituents from the viewpoint of enhancing mechanical strength of the cured product of the photosensitive resin composition.

The content of the compounds having alicyclic or aromatic substituents in the component (c) is preferably 20% by mass or more and 100% by mass or less, more preferably 50% by mass or more and 100% by mass or less.

The viscosity at 20° C. of the component (c) is preferably 1 mPa·s or more and 2 Pa·s or less from the viewpoint of ensuring mixability with the component (a) or the component (b). It is more preferably 1 mPa·s or more and 500 mPa·s or less, and further preferably 1 mPa·s or more and 100 mPa·s or less.

The blending ratio of the component (c) is from 5 to 200 parts by mass, preferably from 20 to 100 s part by mass relative to 100 parts by mass of the component (a). It is suitable to control the blending ratio of the component (c) within the above-described range from the viewpoint of keeping a good balance between the hardness and the tensile strength and elongation of a resulting photosensitive resin cured product, reducing the shrinkage during curing, and securing thickness accuracy.

The number average particle diameter of the primary particles of the component (b) is 5 nm or more and 100 nm or less. It is suitable to control the number average particle diameter of primary particles within this range from the following viewpoints:
(i) the viewpoint of sufficiently absorbing liquid debris and the like generated at the time of laser engraving;
(ii) the viewpoint of easily removing air bubbles mixed at the time of mixing a laser photosensitive resin composition;
(iii) the viewpoint capable of suppressing the particles from overflowing a pattern when a precise pattern is formed by laser engraving to thereby highly maintain the pattern accuracy; and
(iv) the viewpoint of reducing formation of unevenness on the surface of a laser photosensitive resin cured product.

The number average particle diameter of the primary particles of the component (b) is preferably 10 nm or more and 80 nm or less, more preferably 10 nm or more and 50 nm or less. Note that the number average particle diameter of the primary particles of the component (b) is observed using a transmission electron microscope and is measured based on the image displayed on a monitor. The particle diameter of each primary particle is measured in the state where at least 100 or more primary particles are displayed on the monitor. The primary particles are photographed, and then the photograph is directly measured or processed using an image processing software.

The particle shape of the component (b) is not particularly limited. Examples of the shape include a spherical shape, a flat shape, a needle shape, an amorphous shape, or a shape having projections on the surface thereof. A spherical particle is particularly preferred from the viewpoint of abrasion resistance and securing smooth polishing at the time of performing surface polish of a printing plate.

Further, the component (b) is preferably a nonporous ultrafine particle. In the present embodiment, the nonporous ultrafine particle is defined as that having a pore volume as measured by a nitrogen adsorption method (a value determined from the adsorption isotherm of nitrogen at −196° C.) of less than 0.1 ml/g. It is suitable to use such a nonporous ultrafine particle from the viewpoint of capable of suppressing the phenomenon of excessive increase in the viscosity of a composition to thereby secure shapability when blended with the component (a) and/or the component (c), and from the viewpoint of sufficiently maintaining the mechanical strength of the ultrafine particle.

The specific surface area of the component (b) is preferably 10 m$^2$/g or more and 1,000 m$^2$/g or less, more preferably 50 m$^2$/g or more and 800 m$^2$/g or less, further preferably 100 m$^2$/g or more and 500 m$^2$/g or less. It is suitable to control the specific surface area value within such a range from the viewpoint of the efficiency in removing liquid debris generated at the time of laser engraving. Note that the specific surface area in the present embodiment is a value determined on the basis of the BET equation from the adsorption isotherm of nitrogen at −196° C.

The component (b) is preferably the one which is not thermally decomposed at a high temperature. For example, the mass reduction percentage when it is held at 950° C. for 1 hour us preferably 10% by mass or less. When the mass reduction percentage is within the above-described range, it can be present in a resin without being decomposed with the heat at the time of engraving with a laser beam. The mass reduction percentage is more preferably 5% by mass or less, further preferably 3% by mass or less.

The component (b) is preferably an ultrafine particle produced by any of flame hydrolysis, an arc process, a plasma process, a precipitation method, a gelling method, or a fused solid method from the viewpoint of realizing the nonporous ultrafine particle mentioned above. Flame hydrolysis, an arc process, and a plasma process are also referred to as a thermal decomposition process or a high temperature process (dry process). Further, a precipitation method and a gelling method are also referred to as a wet process. Among these, those produced by a dry process, particularly by flame hydrolysis are preferred.

The component (b) may be an organic ultrafine particle such as an ultrafine particle containing a silicone compound or a polyimide ultrafine particle, but it is preferably an inorganic particulate from the viewpoint of suitably realizing the nonporous ultrafine particle mentioned above. Examples of such inorganic microparticles include a compound composed, as a main component, of at least one selected from the group consisting of alumina, silica, zirconium oxide, barium titanate, strontium titanate, titanium oxide, silicon nitride, boron nitride, silicon carbide, chrome oxide, vanadium oxide, tin oxide, chrome oxide, vanadium oxide, tin oxide, bismuth oxide, germanium oxide, aluminum borate, nickel oxide, molybdenum oxide, tungsten oxide, iron oxide, and cerium oxide. Each of these compounds may be used alone or may be used in combination.

When the organic ultrafine particle is used, it is preferably a highly heat-resistant ultrafine particle. The temperature where the weight is reduced to 50% by mass of the initial weight in the thermogravimetric analysis in an inert gas can be used as an index of heat resistance. The temperature is preferably 400° C. or higher, more preferably 450° C. or higher, further preferably 500° C. or higher. Using a highly heat-resistant organic ultrafine particle has an effect in the adsorption and removal of the liquid debris generated at the time of laser engraving. Note that the thermogravimetric analysis refers to a method of measuring the weight while heating a sample.

The "main component" in the present embodiment means that the proportion of a specific component in the matrix component is preferably 50% by mass or more, more preferably 70% by mass or more, further preferably 90% or more, and may be 100% by mass.

The component (b) may comprise a more hydrophilized or hydrophobized particle obtained by coating the surface thereof with a silane coupling agent, a titanium coupling agent, another organic compound, or the like (surface modification treatment). A compound having a polymerizable unsaturated group can be used as an organic compound for such a surface treatment.

Many of the oxides mentioned above have hydroxyl groups on the surface thereof and are classified into hydrophilic microparticles. Such hydrophilic microparticles are allowed to react with ammonia using the hydroxyl groups to introduce amino groups on the surface thereof. Further, the surface hydroxyl groups are allowed to react with silane coupling agents having functional groups such as a chlorosilyl group, a dichlorosilyl group, a trichlorosilyl group, an ethoxysilyl group, and a methoxysilyl group to thereby hydrophobize the surface of the hydrophilic microparticles. Hydrophobizing of microparticles is effective in obtaining high dispersibility in the photosensitive resin composition. On the other hand, use of hydrophilic microparticles is effective in increasing the thixotropy of the photosensitive resin composition. Increasing the thixotropy leads to ensuring the shapability, particularly the shapability at the time of shaping it onto a cylindrical support, which can contribute to the improvement in shapability of the photosensitive resin composition.

In the present embodiment, a simple method of distinguishing between hydrophilic microparticles and hydrophobic microparticles is a method of observing the dispersibility thereof in water. About 150 ml of water is put into a glass container, and about 3 g of microparticles are put into the container from above the water. Then, the water is stirred with a stirring bar put in the water for 5 minutes at 50 revolutions per minute. If the microparticles are hydrophilic microparticles, they will be dispersed in water, but if the microparticles are hydrophobic microparticles, they will be observed to be separated and float on water. Even in the case of hydrophobic microparticles, since air will be incorporated into the surface of the particles at the same time water molecules are incorporated thereinto when water is vigorously stirred, a phenomenon is observed where the liquid in which the microparticles are dispersed seems to have greatly expanded. Hydrophilic microparticles can be defined as the microparticles whose coefficient of cubical expansion $((V_1-V_0)/V_0)$ is 20% or less, wherein $V_0$ represents the volume of initial water and $V_1$ represents the volume of water after the microparticles are dispersed therein.

It is suitable to use hydrophilic microparticles as the component (b) from the viewpoint of enhancing the effect of adsorbing (liquid) engraving debris and changing it into powdered debris. It is surmised that this effect is because the (liquid) debris which is a decomposition product or a molten product generated at the time of laser engraving can be satisfactorily adsorbed.

When using silica microparticles as the above component (b), it is possible to identify the type of functional groups present on the surface of silica microparticles by using the nuclear magnetic resonance spectroscopy ($^{29}$Si—NMR) on silicon atoms.

When using silica microparticles as the above component (b), it is also possible to quantify the concentration of a surface hydroxyl group (silanol group).

The microparticles are vacuum dried at 100° C. in a vacuum of less than $10^{-2}$ mbar in order to lower the influence of water adsorbed to the surface. The silanol group is then allowed to react with lithium aluminum hydride ($LiAlH_4$) in diethylene glycol dimethyl ether, and the pressure is measured to determine the amount of hydrogen separated. The value of the specific surface area (unit: $m^2/g$) measured separately can be used to calculate the silanol group density (unit: piece/$nm^2$). This is based on the chemical reaction in which four silanol groups are allowed to react with one molecule of lithium aluminum hydride to generate four hydrogen molecules.

The silanol group density which is used as the criterion to quantitatively evaluate the hydrophilicity of silica ultrafine particles is preferably 1 piece/$nm^2$ or more, more preferably 1.7 pieces/$nm^2$ or more, further preferably 2 pieces/$nm^2$ or more. When other inorganic oxides have surface hydroxyl groups, it is possible to determine the surface hydroxyl group density using a compound such as lithium aluminum hydride which reacts with the surface hydroxyl group.

It is preferred to further blend a surfactant with the photosensitive resin composition of the present embodiment from the viewpoint of improving the dispersibility of the component (b). Such a surfactant preferably has a hydrogen-bonding functional group in the molecule from the viewpoint of securing compatibility with the component (b). Since such a hydrogen-bonding functional group has a strong interaction with the hydroxyl group which may be present on the surface of the component (b), it is effective in stably keeping the component (b) in the photosensitive resin composition for a long period of time. Presence of the hydrogen-bonding functional group can be clarified by conducting $^1$H-NMR analysis (nuclear magnetic resonance spectroscopy).

Especially, it is particularly desirable to use a nonionic surfactant, particularly a nonionic surfactant having a hydrogen-bonding functional group (hereinafter, may be abbreviated to "component (d)"), because the above-described dispersibility improvement effect becomes remarkable. For example, a polyethylene glycol type and a polyhydric alcohol type nonionic surfactants as described in Table 2-5-1 on p. 92 of "Shin Kaimen-kasseizai Nyumon (Introduction to Surfactant (New Version)) by Takehiko Fujimoto, published on November 1, Showa 60 (1985), by Sanyo Chemical Industries, Ltd." can be applicable as such a nonionic surfactant.

Examples of the polyethylene glycol type nonionic surfactant include compounds prepared by adding ethylene oxide to various hydrophobic groups to introduce hydrophilic groups.

More specifically, examples of the polyethylene glycol type nonionic surfactant include a higher alcohol ethylene oxide adduct, an alkylphenol ethylene oxide adduct, a fatty acid ethylene oxide adduct, a polyhydric alcohol fatty acid ester ethylene oxide adduct, a higher alkylamine ethylene oxide adduct, a fatty amide ethylene oxide adduct, an ethylene oxide adduct of fats and oils, and a polypropylene glycol ethylene oxide adduct. On the other hand, examples of the polyhydric alcohol type nonionic surfactant include compounds prepared by combining a hydrophobic fatty acid with a hydrophilic polyhydric alcohol via an ester or an amide group. More specifically, examples of the polyhydric alcohol type nonionic surfactant include a fatty acid ester of glycerol, a fatty acid ester of pentaerythritol, fatty acid esters of sorbitol and sorbitan, a fatty acid ester of cane sugar, and a fatty amide of alkanolamines.

The HLB (hydrophile-lipophile balance) value of the above nonionic surfactant is preferably from 3 to 12. Examples of such a nonionic surfactant preferably include a polyoxyethylene ether of a higher alcohol having 8 to 24 carbon atoms, a polyoxyethylene ether of alkylphenol, and a polyoxyethylene ether of polypropylene glycol (Pluronic type), which are classified as the above-described polyethylene glycol type surfactant.

Especially, a polyoxyethylene ether of a higher alcohol having 8 to 24 carbon atoms is particularly preferred. Examples of the polyoxyethylene ether of a higher alcohol having 8 to 24 carbon atoms include polyoxyethylene decyl ether, polyoxyethylene lauryl ether, polyoxyethylene cetyl ether, polyoxyethylene stearyl ether, polyoxyethylene 2-ethylhexyl ether, polyoxyethylene tridecyl ether, polyoxyethylene isostearyl ether, polyoxyethylene synthetic alcohol ether (from 12 to 15 carbon atoms in the synthetic alcohol), and polyoxyethylene oleyl ether. These nonionic surfactants may be used alone or in combination.

The blending ratio of the component (d) is from 0.01 to 5 parts by mass, preferably from 0.1 to 1 part by mass, based on 100 parts by weight of the component (a). It is suitable to control the blending ratio of the component (d) within the above-described range from the viewpoint of keeping a good balance between the hardness and the tensile strength and elongation of the resulting photosensitive resin cured product, reducing the shrinkage during curing, and securing thickness accuracy.

It is preferred that the component (b) be dispersed in the component (c) and then mixed with the component (a) or the like from the viewpoint of reducing aggregation and mono-dispersing it in the photosensitive resin composition. It is suitable to mono-disperse the component (b) in the photosensitive resin composition from the viewpoint of well polishing the surface of a printing substrate.

As a method of dispersing the component (c) in the component (b), it is preferred to use at least one method selected from the group consisting of, for example, an ultrasonic dispersion method, a high-speed agitation and dispersion method, a high-speed shear dispersion method, and a bead mill dispersion method, from the viewpoint of applying moderate shear without damaging the component (b) or deteriorating the photosensitive resin composition. As a particularly effective method, a high-speed shear dispersion method and a bead mill dispersion method can be mentioned.

To the photosensitive resin composition of the present embodiment, there can be added, as a photopolymerization initiator, a hydrogen-withdrawing photopolymerization initiator, a degradable photopolymerization initiator, a compound having a site which functions as a hydrogen-withdrawing photopolymerization initiator and a site which functions as a degradable photopolymerization initiator in the same molecule, or the like.

For example, an aromatic ketone is preferably used as, but is not limited to, a hydrogen-withdrawing photopolymerization initiator. Aromatic ketone can be efficiently converted to an excitation triplet state by photoexcitation. There is proposed a chemical reaction mechanism in which such an excitation triplet state withdraws hydrogen from the surrounding medium and generates a radical. The generated radical is considered to participate in the optical crosslinking reaction. Any compound may be used as a hydrogen-withdrawing photopolymerization initiator used in the present embodiment as long as it is a compound which withdraws hydrogen from the surrounding medium through the excitation triplet state and generates a radical.

Examples of such an aromatic ketone include benzophenones, Michler's ketones, xanthenes, thioxantons, and anthraquinones, and it is preferred to use at least one compound selected from these compounds.

Benzophenones refer to benzophenone and derivatives thereof. Specifically, benzophenones include 3,3',4,4'-benzophenone tetracarboxylic acid anhydride and 3,3',4,4'-tetramethoxy benzophenone.

Michler's ketones refer to Michler's ketone and derivatives thereof.

Xanthenes refer to xanthene and derivatives thereof substituted with an alkyl group, a phenyl group, a halogen group, or the like.

Thioxantons refer to thioxanton and derivatives thereof substituted with an alkyl group, a phenyl group, a halogen group, or the like. Examples of thioxantons include ethyl thioxanton, methyl thioxanton, and chloro thioxanton.

Anthraquinones refer to anthraquinone and derivatives thereof substituted with an alkyl group, a phenyl group, a halogen group, or the like.

The proportion of such a hydrogen-withdrawing photopolymerization initiator in the photosensitive resin composition is preferably 0.3% by mass or more and 10% by mass or less, more preferably 0.5% by mass or more and 5% by mass or less. It is suitable to set the proportion within the above range from the viewpoint of sufficiently securing the curability of the surface of a cured product at the time of photocuring the photosensitive resin composition in the air, preventing generation of cracks or the like on the surface thereof during a long term storage, and securing weatherability.

A degradable photopolymerization initiator refers to a compound in which a cleavage reaction occurs in the molecule after light absorption to generate active radicals. Such a degradable photopolymerization initiator is not particularly limited. Specific examples include benzoin alkyl ethers, 2,2-dialkoxy-2-phenylacetophenones, acetophenones, acyloxime esters, azo compounds, organic sulfur compounds, acylphosphine oxides, and diketones, and it is preferred to use at least one compound selected from these compounds.

Examples of benzoin alkyl ethers include benzoin isopropyl ether and benzoin isobutyl ether.

Examples of 2,2-dialkoxy-2-phenylacetophenones include 2,2-dimethoxy-2-phenylacetophenone and 2,2-diethoxy-2-phenylacetophenone.

Examples of acetophenones include acetophenone, trichloroacetophenone, 1-hydroxycyclohexyl phenylacetophenone, and 2,2-diethoxyacetophenone.

Examples of acyloxime esters include 1-phenyl-1,2-propanedione-2-(o-benzoyl)oxime.

Examples of azo compounds include azobisisobutyronitrile, a diazonium compound, and a tetrazene compound.

Examples of diketones include benzil and methylbenzoyl formate.

The proportion of such a degradable photopolymerization initiator in the photosensitive resin composition is preferably 0.3% by mass or more and 10% by mass or less, more preferably 0.5% by mass or more and 5% by mass or less. It is suitable to set the proportion within the above range from the viewpoint of sufficiently securing the curability inside of the cured product when the liquid photosensitive resin composition is photocured in the air.

A compound having a site which functions as a hydrogen-withdrawing photopolymerization initiator and a site which functions as a degradable photopolymerization initiator in the same molecule can also be used as a photopolymerization initiator. Examples of such a compound include α-aminoacetophenones. Specific examples of such a compound include 2-methyl-1-(4-methylthiophenyl)-2-morpholino-propan-1-one and 2-benzyl-2-dimethylamino-1-(4-morpholinophenyl)-butanone.

The proportion of the photopolymerization initiator having a site which functions as a hydrogen-withdrawing photopolymerization initiator and a site which functions as a degradable photopolymerization initiator in the same molecule in the photosensitive resin composition is preferably 0.3% by mass or more and 10% by mass or less, more preferably 0.5% by mass or more and 3% by mass or less. It is suitable to set the proportion within the above range from the viewpoint of sufficiently securing the mechanical properties of the cured product even in the case where the photosensitive resin composition is photocured in the air.

The photosensitive resin composition of the present embodiment can also be blended with a near-infrared absorber in a range which does not impair the object of the present embodiment.

Since the light absorption properties in the near-infrared region of an organic compound is generally very low, it is preferred to add a component which absorbs a near-infrared ray when forming a precise pattern with laser engraving using a near-infrared laser. The content of the near-infrared absorber is preferably 10 ppm or more and 20,000 ppm or less, more preferably 50 ppm or more and 10,000 ppm or less, further preferably 100 ppm or more and 5,000 ppm or less, in terms of securing the mechanical properties of the photosensitive resin cured product.

Examples of near-infrared absorbers include cyanine dyes such as phthalocyanine dye and heptamethine cyanine dye, oxonol dyes such as pentamethine oxonol dye, indolium dyes, benzindolium dyes, benzothiazolium dyes, quinolinium dyes, and phthalide compounds in which the compounds are reacted with a developer. All the cyanine dyes do not have the optical absorption properties as described above. Optical absorption properties extremely vary with the type and the position in the molecule of a substituent, the number of conjugated bonds, the type of counter ions, the surrounding environment where the dye molecule is present, or the like. Commercially available laser dyes, super saturation absorption dyes, and near-infrared absorption dyes can also be used.

Examples of laser dyes include "ADS740PP", "ADS745HT", "ADS760MP", "ADS740WS", "ADS765WS", "ADS745HO", "ADS790NH", and "ADS800NH" (tradenames, all manufactured by American Dye Source, Inc. (Canada)); and "NK-3555", "NK-3509" and "NK-3519" (tradenames, all manufactured by Hayashibara Biochemical Laboratories, Inc.). Further, examples of near-infrared absorption dyes include "ADS775MI", "ADS775MP", "ADS775HI", "ADS775PI", "ADS775PP", "ADS780MT", "ADS780BP", "ADS793EI", "ADS798MI", "ADS798MP", "ADS800AT", "ADS805PI", "ADS805PP", "ADS805PA", "ADS805 PF", "ADS812MI", "ADS815EI", "ADS818HI", "ADS818HT", "ADS822MT", "ADS830AT", "ADS838MT", "ADS840MT", "ADS845BI", "ADS905AM", "ADS956BI", "ADS1040T", "ADS1040P", "ADS1045P", "ADS1050P", "ADS1060A", "ADS1065A", "ADS1065P", "ADS1100T", "ADS1120F", "ADS1120P", "ADS780WS", "ADS785WS", "ADS790WS", "ADS805WS", "ADS820WS", "ADS830WS", "ADS850WS", "ADS780HO" "ADS810CO", "ADS820HO", "ADS821NH", "ADS840NH", "ADS880MC", "ADS890MC", and "ADS920MC" (tradenames, all manufactured by American Dye Source, Inc. (Canada)); "SDO-1000B" (tradename, manufactured by Arimoto Chemical Company, Ltd.); and "NK-3508" and "NKX-114" (tradenames, all manufactured by Hayashibara Biochemical Laboratories, Inc.).

As a phthalide compound in which it is reacted with a developer, the one described in Japanese Patent No. 3271226 can also be used. A metallic phosphate compound can also be used, for example, a complex of a phosphoric ester and a copper salt as described in JP-A-6-345820 and WO 99/10354. It is also possible to use ultrafine particles which have optical absorption properties in a near-infrared region and have a number average particle diameter of 0.3 μm or less, preferably 0.1 μm or less, more preferably 0.08 μm or less. Examples of the ultrafine particles include metal oxides such as yttrium oxide, tin oxide and/or indium oxide, copper oxide, and iron oxide; and metals such as gold, silver, palladium, and platinum. It is also possible to use microparticles such as glass having a number average particle diameter of 5 μm or less, preferably 1 μm or less, wherein the glass is mixed with metal ions such as ions of copper, tin, indium, yttrium, chromium, cobalt, titanium, nickel, vanadium, and rare earth elements.

It is also possible to use carbon-based materials such as carbon black, fulleren, and a carbon nanotube, whose primary particles have a number average particle diameter of from 5 nm to 100 nm.

If a dye reacts with a photosensitive resin composition to result in the change of the light absorption wavelength thereof, it can also be contained in a microcapsule. In such a case, the number average particle diameter of the capsule is 10 μm or less, preferably 5 μm or less, more preferably 1 μm or less. It is also possible to use ion exchanger microparticles which are adsorbed with the ions of metals such as copper, tin, indium, yttrium, and rare earth elements. The ion exchanger microparticles may be organic resin microparticles or inorganic microparticles. Examples of the inorganic microparticles include amorphous zirconium phosphate, amorphous zirconium silicophosphate, amorphous zirconium hexametaphosphate, lamellar zirconium phosphate, reticulated zirconium phosphate, zirconium tungstate, and zeolite. Examples of the organic resin microparticles include an ion exchange resin and an ion exchange cellulose which are usually used.

In addition, a polymerization inhibitor, an ultraviolet absorber, dye, pigment, lubricant, plasticizer, fragrance, and the like can be added to the photosensitive resin composition of the present embodiment depending on applications or objects.

In the present embodiment, the range of the viscosity at 20° C. of a precursor composition excluding the component (b) from the photosensitive resin composition is 5 Pa·s or more and 500 Pa·s or less, preferably 10 Pa·s or more and 200 Pa·s or less, more preferably 20 Pa·s or more and 80 Pa·s or less.

Further, the blending ratio of the component (b) is from 0.1 to 10 parts by mass, preferably from 0.3 to 10 parts by mass, more preferably from 0.5 to 8 parts by mass, further preferably from 0.8 to 5 parts by mass based on 100 parts by mass of the component (a).

In the present embodiment, the photosensitive resin composition with which the component (b) is mixed can be easily shaped into a sheet or a cylinder without significantly increasing the viscosity of the photosensitive resin composition when the following conditions are adopted: the viscosity at 20° C. of a precursor composition excluding the component (b) from the photosensitive resin composition is 5 Pa·s or more and 500 Pa·s or less; and the blending ratio of the component (b) is from 0.1 to 10 parts by mass.

Note that the "precursor composition" as used in the present embodiment means a composition which consists of each component excluding the component (b) from the photosensitive resin composition of the present embodiment.

In the present embodiment, the viscosity at 20° C. of a photosensitive resin composition is 50 Pa·s or more and 10,000 Pa·s or less. The viscosity range as described above can contribute to satisfactorily applying the photosensitive resin composition to a sheet or a cylinder at a relatively low temperature around room temperature (for example at 25° C.). The viscosity range is more preferably 100 Pa·s or more and 8,000 Pa·s or less, further preferably 500 Pa·s or more and 5,000 Pa·s or less. When the composition is shaped into a cylinder, a viscosity range of 100 Pa·s or more and 5,000 Pa·s or less is preferred because a predetermined thickness needs to be maintained against gravity.

Note that the viscosity in the present embodiment is a value measured at 20° C. using a Brookfield viscometer (B8H type manufactured by Tokyo Keiki Co., Ltd., Japan). The No. 7 rotor was used and the rotational speed was 0.5 revolutions per minute.

The photosensitive resin composition of the present embodiment preferably has thixotropy. Thixotropy is a phenomenon in which a hysteresis is produced on a curve of the coefficient of viscosity-shear stress, and it is observed as a phenomenon in which when measuring viscosity using a Brookfield viscometer, the viscosity decreases as the increase in the rotational speed of a rotor. High thixotropy means that, when the photosensitive resin composition is shaped, a large increase in viscosity is observed when the flow of the composition is stopped. Therefore, when the photosensitive resin composition having high thixotropy is shaped onto a cylindrical support, the viscosity of the composition largely increases at the time the shaping is completed and the formed shape is maintained. As a result, a predetermined layer thickness thereof can be held without being influenced by gravity.

As a specific measuring method of the thixotropy in the present embodiment, a Brookfield viscometer (B8H type, manufactured by Tokyo Keiki Co., Ltd., Japan; the rotor is selected from No. 3, No. 4, No. 5, No. 6, and No. 7) is used. The rotational speed of a rotor is set from the lower one, that is, 0.5 revolution per minute, and the rotor and the rotational speed (either of the following four kinds: 1, 2.5, 5, and 10 revolutions per minute) are selected so that the measurement scale may span the range of from 30 to 70.

Here, the rotational speed used for the measurement is represented by $R_0$ (unit: revolution per minute), and the viscosity at $R_0$ is represented by $\eta_0$ (unit: Pa·s).

The rotational speed of a rotor set at 10 times $R_0$ at the same temperature condition is represented by $\eta_1$. The ratio of $\eta_1/\eta_0$ is preferably 0.1 or more and 0.9 or less, more preferably 0.2 or more and 0.8 or less, further preferably 0.2 or more and 0.6 or less, particularly preferably 0.3 or more and 0.4 or less. It is judged that thixotropy is high when the value of this ratio is small.

Note that since the maximum rotational speed of the B8H type viscometer is 100 revolutions per minute, $R_0$ is set at 10 revolutions per minute or less in view of changing the rotational speed 10 times.

The printing substrate in the present embodiment can be formed from the photosensitive resin composition mentioned above. If needed, the embodiment may comprise a support and a photosensitive resin cured product layer provided on the support which is formed from the photosensitive resin composition mentioned above.

Here, the above photosensitive resin cured product can be formed by heat curing, but is preferably formed by photocuring. In this case, the polymerizable unsaturated groups of the component (c) or the polymerizable unsaturated groups of the component (a) and the component (c) are allowed to react with each other to thereby form a three-dimensional crosslinking structure, which produces a tendency of insolubilizing the cured product in ester-based, ketone-based, aromatic, ether-based, alcohol-based, and halogen-based solvents which are usually used. This reaction occurs between the components (c), between the components (a), or between the component (a) and the component (c), and the polymerizable unsaturated groups are consumed. When photocuring is performed using a photopolymerization initiator, the photopolymerization initiator is decomposed by light. Thus, an unreacted photopolymerization initiator and a decomposition product thereof can be identified by extracting the photocured product. When analyzing, it is possible to use a GC-MS method (a method of mass analysis of those separated by gas chromatography), an LC-MS method (a method of mass analysis of those separated by liquid chromatography), a GPC-MS method (a method of mass analysis of those separated by gel permeation chromatography), and an LC-NMR method (a method in which those separated by liquid chromatography are analyzed by nuclear magnetic resonance spectroscopy).

It is also possible to identify the unreacted component (a), the unreacted component (c), and a relatively low-molecular weight product obtained from the reaction of a polymerizable unsaturated group in a solvent extract by analyzing it using a GPC-MS method, an LC-MS method, and a GPC-NMR method. With respect to a polymer component in which a three-dimensional crosslinking structure is formed and which is insoluble in a solvent, it is possible to verify whether a site is present or not which is produced by the reaction of a polymerizable unsaturated group as a component constituting the polymer by using a pyrolysis GC-MS method. For example, it is possible to estimate from a mass spectroscopy spectrum pattern that there is present a site which is produced by the reaction of a polymerizable unsaturated group such as a methacrylate group, an acrylate group, or a vinyl group. The pyrolysis GC-MS method is a method comprising thermally decomposing a sample, separating a gas component produced with gas chromatography, and then subjecting the gas component to mass spectroscopy. When a decomposition product derived from a photopolymerization initiator or an unreacted photopolymerization initiator is detected in the photosensitive resin cured product together with an unreacted polymerizable unsaturated group or a site obtained by the reaction of the polymerizable unsaturated group, it is possible to conclude that it is obtained by photocuring the photosensitive resin composition.

The component (b) in the photosensitive resin cured product can be isolated by heating the photosensitive resin cured product in a high temperature atmosphere in which oxygen such as air is present to thermally decompose organic components. It is also possible to analyze the isolated component (b) for physical properties such as the number average particle diameter of primary particles, the specific surface area, and the pore volume.

Further, the component (b) or the photopolymerization initiator in the photosensitive resin composition can be separated and purified using liquid chromatography such as a GPC method or an LC method, and then the molecular structure thereof can be identified using nuclear magnetic resonance spectroscopy (NMR method). It is possible to identify what kind of functional group is present in the molecule by analyzing a chemical shift peculiar to the functional group using the NMR method ($^1$H-NMR method) in which attention is paid to a hydrogen atom.

Organic substances such as resin components of the photosensitive resin composition used in the present embodiment are dissolved in a solvent; the component (b) is removed; and then the solvent is removed by means of a method such as vacuum distillation, thereby allowing us to evaluate the properties of a resin which is obtained by removing the component (b) from the photosensitive resin composition. For example, physical properties such as viscosity at 20° C. can be evaluated.

Existing resin-shaping methods can be used for the method for shaping the photosensitive resin composition of the present embodiment into a sheet or a cylinder. Examples of the methods include a casting method, a method in which a resin is extruded from a nozzle or a die by a machine such as a pump or an extruder and the thickness is adjusted by a blade or by calendering with a roll, and a method of spraying with a spray. In these cases, it is also possible to perform the shaping while heating the photosensitive resin composition in the range where it is not thermally decomposed. Rolling treatment, grinding treatment, etc. may also be performed if needed.

Usually, it is shaped on a sheet shaped support composed of a material such as PET or nickel in many cases, but it can be directly shaped on the cylinder of a printing machine. It is also possible to use a cylindrical support such as a sleeve made of a plastic such as a polyester resin or an epoxy resin which is reinforced with a fiber such as glass fiber, aramid fiber, or carbon fiber, and a tube made of a polyester such as polyethylene terephthalate. The support in the present embodiment includes such a sheet shaped support, a cylindrical support, and a cylinder-like support.

The role of the sheet shaped support or the cylindrical support is to secure the dimensional stability of the photosensitive resin cured product. Therefore, it is preferred that these supports have high dimensional stability. When a desirable material for these supports is evaluated using a coefficient of linear thermal expansion, the upper limit is preferably 100 ppm/° C. or less, more preferably 70 ppm/° C. or less. Specific examples of the material include a polyester resin, a polyimide resin, a polyamide resin, a polyamide-imide resin, a polyetherimide resin, a poly bismaleimide resin, a polysulfone resin, a polycarbonate resin, a polyphenylene ether resin, a polyphenylene thioether resin, a polyether sulfone resin, a liquid crystal resin composed of a wholly aromatic polyester resin, a wholly aromatic polyamide resin, and an epoxy resin. It is also possible to form each layer of these resins for use in the support. A porous sheet such as cloth formed by knitting fibers, non-woven fabrics, and a film in which pores are formed can be used as a back film. When a porous sheet is used as a back film, high adhesiveness can be obtained by impregnating the pores with the photosensitive resin composition and then subjecting the composition to photocuring because the resulting photosensitive resin cured product layer is integrated with the back film. Examples of the fiber which forms cloth or non-woven fabrics include inorganic fibers such as glass fiber, alumina fiber, carbon fiber, alumina silicate fiber, boron fiber, high silicon fiber, potassium titanate fiber, and sapphire fiber; natural fibers such as cotton and hemp; semi-synthetic fibers such as rayon and acetate; and synthetic fibers such as nylon, polyester, acrylic, vinylon, polyvinyl chloride, polyolefin, polyurethane, polyimide, and aramid. Further, cellulose produced by bacteria is a highly-crystalline nanofiber, which is a material capable of producing thin non-woven fabrics with high dimensional stability.

That is, the support preferably comprises at least one selected from the group consisting of fiber reinforced plastics, film reinforced plastics, and metal, as a main component.

Further, examples of the methods for reducing the coefficient of linear thermal expansion of the support include a method of adding a filler and a method of impregnating or coating a mesh cloth of a wholly aromatic polyamide or the like, glass cloth, or the like with a resin. As the filler, it is possible to use organic microparticles usually used, inorganic microparticles such as a metal oxide or metal, organic/inorganic composite microparticles, and the like. It is also possible to use porous microparticles, microparticles having a cavity inside, microcapsule particles, and laminar compound particles into which a low-molecular compound is intercalated. Particularly useful particles include metal oxide microparticles such as alumina, silica, titanium oxide, and zeolite, latex microparticles composed of a polystyrene-polybutadiene copolymer, and natural-based organic microparticles such as highly-crystalline cellulose, and the like.

Adhesiveness of the support used in the present embodiment with the photosensitive resin composition layer or an adhesive layer can be improved by physically or chemically treating the surface of the support. Examples of the physical treatment method include sandblasting, wet blasting in which a liquid containing microparticles is injected, corona discharge treatment, plasma treatment, and irradiation of ultraviolet rays or vacuum ultraviolet rays. Examples of the chemical treatment method include a strong acid and strong alkali treatment method, an oxidizing agent treatment method, and a coupling agent treatment method.

The formed photosensitive resin composition layer is crosslinked by photoirradiation and forms the photosensitive resin cured product. The composition layer can also be crosslinked by photoirradiation while it is formed. Examples of the light source used for curing include a high pressure mercury lamp, an ultrahigh pressure mercury lamp, an ultraviolet fluorescent lamp, a bactericidal lamp, a carbon-arc lamp, a xenon lamp, and a metal halide lamp. The light irradiated to the photosensitive resin composition layer preferably includes a light with a wavelength of 200 to 300 nm. Particularly, hydrogen-withdrawing photopolymerization initiators, many of which have strong light absorption in the above wavelength region, can sufficiently secure the curability on the surface of the photosensitive resin cured product layer, when the initiator is irradiated with the light with a wavelength of 200 to 300 nm. The number of the type of the light sources used for photocuring may be one. However, two or more types of light sources may be used, since the resin curability may be improved by curing the resin with two or more types of light sources having different wavelengths.

The thickness of the photosensitive resin cured product may be arbitrarily set in a range of 50 μm or more and 100 mm or less depending on the purpose of use thereof, but when the cured product is used as a substrate for printing, the thickness is generally preferably from 0.1 to 50 mm, more preferably from 0.1 to 10 mm. Optionally, the photosensitive resin cured product may be formed as multiple layers corresponding to multiple materials having different compositions.

According to the present embodiment, a cushion layer of an elastomer can also be formed in the lower part of the photosensitive resin cured product layer. The cushion layer is preferably an elastomer layer having a Shore A hardness of 10 degree or more and 70 degree or less, or an ASKER-C hardness as measured with an ASKER-C type hardness meter of 20 degree or more and 85 degree or less. When the elastomer layer has a Shore A hardness of 10 degree or more or an ASKER-C hardness of 20 degree or more, printing quality can be secured because it is suitably deformed. Further, when the elastomer layer has a Shore A hardness of 70 degree or less or an ASKER-C hardness of 85 degree or less, the elastomer layer can play a role of a cushion layer. A more preferred range of the Shore A hardness is from 20 to 60 degree, and a more preferred range of the ASKER-C hardness is from 45 to 75 degree. It is preferred that the Shore A hardness and the ASKER-C hardness be properly used depending on the material used for the cushion layer. The difference between the two types of hardness originates in the difference in the indenter point shape of the hardness meters used for the measurements. It is preferred to use the Shore A hardness in the case of a uniform resin composition, and it is preferred to use the ASKER-C hardness in the case of a nonuniform resin composition such as an expandable substrate such as polyurethane foam and polyethylene foam. The ASKER-C hardness is a measuring method based on JIS K7312 standard.

The cushion layer is not particularly limited, but may be any type of layer as long as it has rubber elasticity, including a thermoplastic elastomer, a photocuring elastomer, and a thermosetting elastomer. It may be a porous elastomer layer with micropores. In particular, from the viewpoint of processability to a sheet-shaped or a cylindrical printing plate, it is simple and preferred to use a photocurable liquid photosensitive resin composition which forms an elastomer after curing.

The cushion layer may also be a cushion layer having closed or open cells in the layer, composed of a material such as polyurethane foam or polyethylene foam. Commercially available cushioning materials and cushion tapes can also be used. Adhesives or pressure sensitive adhesives may be applied to one side or both sides of the cushion layer.

It is suitable that the printing plate of the present embodiment is a printing plate comprising a relief pattern formed on the surface of the printing substrate.

In addition, the method for producing the printing plate of the present embodiment is a production method comprising a laser engraving step of forming a relief pattern on the surface of the printing substrate by a pulsed near-infrared laser beam, wherein the average light source output of the pulsed near-infrared laser beam is 0.01 W or more and less than 5 W.

When the photosensitive resin cured product of the present embodiment is used as a printing substrate on which a pattern is formed using a laser engraving process, in the laser engraving process, a desired image is converted into digital data and a relief pattern (corresponding to the desired image) can be formed on the printing element by controlling a laser irradiation apparatus by a computer having the above-mentioned digital data. The laser used for the laser engraving may be any type of laser so long as the laser comprises a light having a wavelength which can be absorbed by the printing element. However, a laser with high output is desirable in order to perform the laser engraving at high speed, and preferred are an infrared laser or an infrared-emitting solid state laser such as a carbon dioxide laser, a YAG laser, and a semiconductor laser. Further, the second harmonics of a YAG laser having an oscillation wavelength in a visible light region, a copper vapor laser, ultraviolet lasers having an oscillation wavelength in an ultraviolet region, such as an excimer laser, and a YAG laser tuned to the third or fourth harmonics may be used for the abrasion treatment which breaks the linkages in the organic compounds and hence, are suitable for forming precise patterns. The laser irradiation may be either a continuous irradiation or a pulse irradiation. A pulse irradiation having a small thermal effect at the time of laser engraving is preferred from the viewpoint of forming precise patterns.

By using the photosensitive resin composition mentioned above, it is possible to use a laser having a low average output as a light source in the production method of the present embodiment. Thus, it is possible to manufacture a laser engraving apparatus capable of forming precise patterns at a low cost. It is preferred that a region of the printing element from the surface thereof to a depth of at least 50 μm (preferably from 50 to 80 μm, more preferably from 50 to 100 μm) (hereinafter referred to as a surface portion) preferably comprise a resin cured product having light transmittance in a near-infrared region. Here, "having light transmittance in a near-infrared region" means having a suitable light transmittance to enable laser engraving of precise patterns using a pulsed near-infrared laser having a low average output.

It is preferred that the surface portion of the printing element comprise a resin cured product having light transmittance in an ultraviolet region in terms of sufficiently securing mechanical strength. Note that the surface portion means a portion excluding a modified layer when the printing element has a modified layer to be described below on the surface thereof. Further, the resin cured product in the surface portion of the printing element has a light transmittance of 20% or more and 95% or less in the oscillation wavelength of a pulsed near-infrared laser used in a laser engraving step, and 1% or more and 80% or less at 365 nm.

Note that the light transmittance is a value as measured using a resin cured product, which is cured by setting the thickness to 50 μm, by a light transmission method in an ultraviolet/visible/near-infrared spectrophotometer. It is preferred that the light transmittance in the oscillation wavelength of a near-infrared laser used for laser engraving be 20% or more and 95% or less in that laser engraving in a depth direction is performed deeply enough and it is possible to use a laser having a low average output as a light source. The light transmittance is more preferably 30% or more and 90% or less, further preferably 40% or more and 85% or less. Further, it is preferred that the light transmittance at 365 nm, a wavelength in an ultraviolet region, be in the range of 1% or more and 80% or less in that the mechanical strength of the resin cured product can be sufficiently secured, and it can be used for a printing step. The light transmittance is more preferably 5% or more and 80% or less, further preferably 10% or more and 80% or less.

The laser used in the present embodiment is preferably a pulsed near-infrared laser having an oscillation wavelength in a near-infrared region. The near-infrared region is defined as a region having a wavelength of 700 nm or more and 3 μm or less. The type of the near-infrared laser is not particularly limited, but examples thereof include a semiconductor laser-pumped solid state laser or a lamp-pumped solid state laser, a semiconductor laser, and a fiber laser. A semiconductor laser-pumped solid state laser and a fiber laser are particularly preferred from the stability of oscillation and the ease of handling. Specific examples of the solid state laser include an alexandrite laser, a titanium sapphire laser, a Cr:LiSAF laser, a F-Center laser, a Co:MgF2 laser, a Nd:YAG laser, a Nd:YLF laser, a Nd:YVO$_4$ laser, an Er:glass laser, a Ho:YAG laser, a Ho:YSGG laser, a Tm:YAG laser, and an Er:YAG laser. In the case of a semiconductor laser-pumped solid state laser, there are two types of pumping methods, a side-pumping method and an end-pumping method, but the end-pumping method is preferred for obtaining an excellent shape of beam. The fiber laser is a laser using a fiber having a core doped with a rare earth element such as Yb or Er, and uses the fiber as an amplification medium.

The laser used in the present embodiment is preferably a pulsed near-infrared laser, and the repetition frequency thereof is preferably 20 Hz or more and 500 MHz or less. The repetition frequency is more preferably 1 kHz or more and 200 MHz or less, further preferably 10 kHz or more and 100 MHz or less. An oscillating frequency in the range of 20 Hz or more and 500 MHz or less is preferred in that it allows us to perform laser engraving by scanning the laser beam at high speed and to decrease the time required for the engraving step.

The pulse width of the pulsed near-infrared laser used in the present embodiment is preferably 1 femtosecond or more and 200 nanoseconds or less. The pulse width is more preferably in the range of 10 femtoseconds or more and 100 nanoseconds or less, further preferably 10 femtoseconds or more and 30 nanoseconds or less. A pulse width of 1 femtosecond or more and 200 nanoseconds or less is preferred in that high energy can be supplied within a very short time since high highest peak output can be obtained even when the average output of the laser is small. As a result, the photosensitive resin cured product can be easily engraved and an excellent shape of patterns can be obtained because of the effect in suppressing the influence of heat. It is preferred to use a mode locking technique as a method of obtaining the femtosecond and the picosecond pulse. In addition, the laser having Q-switching is preferred as a method of obtaining a short pulse having high highest peak output.

The average output of the pulsed near-infrared laser of the present embodiment is 0.01 W or more and less than 5 W, preferably 0.05 W or more and 2 W or less, more preferably 0.05 W or more and 1 W or less, further preferably 0.1 W or more and 0.5 W or less.

The average output of the pulsed near-infrared laser which has been conventionally generally used is from 100 W to several kW, but it is preferred to perform engraving with a relatively low average output in the present embodiment. Specifically, when the resin cured product formed from the photosensitive resin composition of the present embodiment is subjected to laser engraving by a relatively low average output of 0.01 W or more and less than 5 W, a precise pattern can be formed satisfactorily and edge shape of the pattern obtained can be made clearer, although the details of the mechanism are not clear. Moreover, such a laser engraving method can reduce influence of heat and can provide a relief pattern having a width substantially equal to the diameter of a laser beam without excessive melting or removal.

The power per pulse of the pulsed near-infrared laser beam is preferably 10 W or more and 20 kW or less, more preferably 20 W or more and 10 kW or less, further preferably 100 W or more and 5 kW or less. The power per pulse is preferably 10 W or more in that the resin cured product can be easily laser-engraved and the resulting pattern has a clear edge shape. Moreover, a power per pulse of 20 kW or more can reduce influence of heat and can provide a relief pattern having a width substantially equal to the diameter of a laser beam without excessive melting or removal. The power pulse (unit: W) is defined as a value of the average output (unit: W) divided by the repetition frequency (unit: pulse per second) further divided by the pulse width (time width of one pulse, unit: second). When this value is large, it is meant that the power per pulse is large and the highest peak output is large.

In the present embodiment, in order to form a precise pattern (particularly, a relief pattern having a width of 1 μm or more and less than 20 μm and a depth of 1 μm or more and less than 100 μm) with sufficient precision, it is preferred that the laser beam outputted from a pulsed near-infrared laser be condensed to a diameter of 1 μm or more and less than 20 μm and the surface of the printing element made of the resin comprising the photosensitive resin cured product is irradiated with the condensed beam. The depth of the resin cured product engraved by one pulse of the pulsed near-infrared laser is preferably 0.05 μm or more and 10 μm or less. A depth of the resin cured product engraved by one pulse in the range of 0.05 μm or more and 10 μm or less is preferred in that it is possible to form a relief pattern having a size comparable to the diameter of the laser beam, and in that it is possible to deeply engrave the same place by a plurality of pulses using a pulsed near-infrared laser with high repetition frequency. In order to condense a laser beam, it is preferred to use a condenser lens.

In particular, when a laser beam is scanned to a relatively large width or region in the single axial or bi-axial direction using a galvanomirror, an fθ lens with a large size is used suitably. In the present embodiment, since a material which is irradiated with a laser beam is a resin cured product, it is possible to form a relief pattern having a width substantially equal to the diameter of a beam to be irradiated by using a laser with a low average output. The laser beam before being condensed preferably has a single mode oscillation, i.e., a $TEM_{00}$ mode oscillation because the laser beam of the pulsed near-infrared laser used in the present embodiment is condensed into a very small spot. Further, the $M^2$ (mode quality) value which is an index showing the quality of the horizontal mode of a laser is preferably 1 or more and 2 or more, more preferably 1 or more and 1.5 or less.

In the laser engraving, a desired image is generally converted into digital data and a relief image (corresponding to the desired image) is formed on the printing element by controlling a laser irradiation apparatus by a computer having the above-mentioned digital data.

In the method of the present embodiment, a precise pattern is formed by using a pulsed near-infrared laser. However, when a coarser pattern (for example, a pattern having a width of more than 20 μm) is present in the same printing plate, the laser engraving step can further comprise an engraving step in which an infrared laser is used. In this case, the infrared laser may be of continuous oscillation or pulse oscillation, and it is preferred to laser-engrave the surface of the printing element made of a resin with a beam having a diameter of 15 μm or more and less than 100 μm. It is also possible to perform engraving with an infrared laser having an oscillation wavelength of 5 μm or more and 20 μm or less so that the engraving treatment may be performed in a short time. As a specific example of particularly preferred infrared lasers, a carbon dioxide laser can be mentioned. The oscillation mode of the carbon dioxide laser may be pulse oscillation or continuous oscillation. It is also possible to condense the laser beam outputted from an infrared laser to a diameter of 15 μm or more and less than 100 μm to form a coarse relief pattern having a width exceeding 15 μm and a depth of 100 μm or more.

In the present embodiment, the number of beams of a pulsed near-infrared laser and the number of beams of an infrared laser are preferably at least one, respectively. This is preferred because engraving speed can be significantly improved by using a plurality of laser beams. The engraving by a pulsed near-infrared laser and the engraving by an infrared laser may be performed simultaneously or separately. It is preferred to simultaneously perform the both from the viewpoint of shortening the time required for engraving. However, this limitation is not applied when the scanning modes of laser beams differ in a laser engraving apparatus. For example, this is a case where the pulsed near-infrared laser is scanned using a galvanomirror while the infrared laser is used for engraving without using a galvanomirror.

In the laser engraving step of the present embodiment, it is preferred, in terms of laser engraving speed, to irradiate a printing element with a laser beam in the state where a sheet-shaped printing element is wound and fixed around a cylinder surface, or where a cylindrical printing element is installed on a cylinder, while rotating the cylinder in the peripheral direction with the longitudinal axis thereof being fixed. This is because it is possible to perform laser engraving while rotating the cylinder at a high speed. As a method of irradiating with a laser beam, preferred is a method of sweeping a laser beam across the cylinder in the longitudinal axis direction of thereof or scanning the laser beam in the longitudinal axis direction of the cylinder using a galvanomirror while rotating the cylinder, in terms of securing the accuracy of position in laser engraving. The engraving apparatus used for laser engraving is preferably an apparatus of the type that equips a cylinder and performs engraving while rotating the same. In particular, this is a preferred method when a cylindrical printing plate is produced.

Since the pulsed near-infrared laser used in the present embodiment has high oscillating frequency, a method of scanning using a galvanomirror is preferred, in the scanning method of a laser beam. Scanning a laser beam in the longitudinal axis direction of the cylinder using a galvanomirror comprises the steps of rotating the cylinder by one rotation according to the image data divided in the longitudinal axis direction of the cylinder to laser-engrave one round of patterns and then moving the galvanomirror in the longitudinal axis direction of the cylinder or moving the cylinder in the longitudinal axis direction thereof. Thus, it becomes possible to perform the laser engraving of the patterns corresponding to all the image data by repeatedly performing a series of the above steps.

The laser engraving apparatus used in the present embodiment is preferably an apparatus comprising a pulsed near-infrared laser, a galvanomirror for scanning a laser beam in the longitudinal axis direction of a cylinder, a condenser lens for condensing the laser beam, and an optical shutter or a mechanical shutter, wherein the apparatus further comprises a mechanism to hold the longitudinal axis of the cylinder, a mechanism to rotate the cylinder which is held in the peripheral direction thereof, and a mechanism to move the galvanomirror in the longitudinal direction of the cylinder or a mechanism to move the cylinder in the longitudinal direction thereof. Further, the laser engraving apparatus is preferably an apparatus comprising a continuous infrared laser and an optical shutter, or a pulsed near-infrared laser and an optical shutter or a mechanical shutter, wherein the apparatus further comprises a condenser lens for condensing the laser beam, and a mechanism to move the laser beam in the longitudinal direction of the cylinder or a mechanism to move the cylinder in the longitudinal direction thereof. The galvanomirror is an optical component for scanning a laser beam in the single axial or bi-axial direction by the control of a computer, and it is also referred to as a galvanoscanner. There are a moving coil type and a moving magnet type according to the drive system of a mirror part, and it can be used properly by the oscillating frequency of the laser to be used, the scanning accuracy, and the scanning area. As the optical shutter, it is preferred to use an acoustooptic modulator (AO modulator).

The laser engraving is performed in an atmosphere of an oxygen-containing gas, generally in the presence or flow of air, but it may also be performed in an atmosphere of carbon dioxide gas or nitrogen gas. The powdered or liquid substance slightly generated on the surface of a relief printing plate after completing the engraving may be removed using a suitable method, for example, a method of washing with water containing a solvent or a surfactant or the like, a method of applying an aqueous cleaning agent by high-pressure spraying or the like, a method of applying high-pressure steam, or the like.

In the present embodiment, after the engraving in which a laser beam is irradiated to form a relief pattern, it is also possible to perform postexposure in which the printing plate surface with patterns formed thereon is irradiated with a light having a wavelength of 200 nm to 450 nm following the step of removing powdered or viscous liquid debris remaining on the plate surface. This is a method having an effect in surface tack removal. The postexposure can be performed in any environment, specifically, in the air, in an inert gas atmosphere, or in water. It is particularly effective when a hydrogen-withdrawing photopolymerization initiator is contained in the photosensitive resin composition to be used. Before the postexposure step, the printing plate surface can also be treated with a treatment solution containing a hydrogen-withdrawing photopolymerization initiator, followed by exposure. It is also possible to expose the printing plate in the state where the printing plate is immersed in a treatment solution containing a hydrogen-withdrawing photopolymerization initiator.

EXAMPLES

The present embodiment will be more specifically described below with respect to Examples and Comparative Examples, but the present embodiment is not to be limited to the following Examples, unless the present embodiment departs from the gist thereof.

(1) Measurement of Number Average Molecular Weight and Molecular Weight

The number average molecular weight of component (a) was determined by means of gel permeation chromatography (GPC method) and expressed in terms of a polystyrene having a known molecular weight. The measurement was performed by developing samples with tetrahydrofuran (THF) using a high speed GPC device (tradename: HLC-8020, manufactured by TOSOH CORPORATION, Japan) and a polystyrene packed column (tradename: TSKgel GMHXL; manufactured by TOSOH CORPORATION, Japan). The temperature of the column was set at 40° C. A THF solution having a resin concentration of 1% by mass was prepared as a sample to be injected into the GPC device, and the injection quantity was 10 μl. An ultraviolet detector was used as a detector of component (a), and a light of 254 nm was used as a monitor light.

The molecular weight of component (c) was calculated from the molecular structure identified using the nuclear magnetic resonance spectroscopy ($^1$H-NMR method) as described below in (3).

(2) Measurement of the Number of Polymerizable Unsaturated Groups

The average number of polymerizable unsaturated groups which are present in the molecule of component (a) which was synthesized was determined by removing an unreacted low-molecular component using liquid chromatography and then analyzing the molecular structure using the $^1$H-NMR method.

(3) Measurement of Nuclear Magnetic Resonance Spectroscopy ($^1$H-NMR)

Measurement of $^1$H-NMR was performed using "JNM-LA400" (tradename) manufactured by JEOL, Ltd. The measurement was performed at an observation frequency of 400 MHz, setting an integration count at 256 times, and using tetramethylsilane (TMS) as a standard substance.

(4) Laser Engraving Method

A: Laser engraving was performed by means of a carbon dioxide laser engraving apparatus (tradename: ZED-mini-1000, manufactured by ZED Co., Ltd., United Kingdom, mounted with a 250 W output carbon dioxide laser, manufactured by Coherent Co., Ltd., USA). The laser engraved pattern included portions corresponding to halftone dots (screen ruling=80 lines per inch, and total area of halftone dots=approximately 10%, based on the halftone area of a print obtained using the engraved pattern), 500 μm-wide relief lines (convex lines) and 500 μm-wide reverse lines (grooves). When the laser engraving is performed so that the engraving depth becomes large, a problem arises wherein a satisfactorily large area of the top portion of a precise halftone relief pattern cannot be obtained, so that the destruction of the portions corresponding to halftone dots occurs and the printed dots become unclear. For preventing this problem, the laser engraving was performed with the engraving depth of 0.55 mm.

B: Laser engraving was performed in a two-step processing of precise patterns and coarse patterns. "BL6-106Q" (tradename, manufactured by Spectra-Physics KK) was used for the laser engraving of the precise patterns. The fundamental wave (1064 nm) of Nd:YVO$_4$ laser, which is a semiconductor laser end-pumped Q-switching solid-state laser, was used. The beam was condensed to a diameter of 10 μm with a lens. The repetition frequency of the laser was 35 kHz. The pulse width was 8 nanoseconds. The average output was 1 W. The power per pulse was 3.6 kW. Laser engraving of coarse patterns was performed by means of a carbon dioxide laser engraving apparatus "ZED-mini-1000" (tradename: manufactured by ZED Co., Ltd., United Kingdom, mounted with a 250 W output carbon dioxide laser, manufactured by Coherent Co., Ltd., USA).

C: Laser engraving was performed in a two-step processing of a precise patterns and coarse patterns. A pulse fiber laser "PFL-9" (tradename, manufactured by JDS Uniphase, Co., Ltd.) (a wavelength of 1060 nm) was used for the laser engraving of the precise patterns. The beam diameter was 8 μm (condensed with an fθ lens). The repetition frequency of the laser was 50 kHz. The pulse width was 120 n seconds. The average output was 1 W. The power per pulse was 167 W. Laser engraving of coarse patterns was performed by means of a carbon dioxide laser engraving apparatus "ZED-mini-1000" (tradename: manufactured by ZED Co., Ltd., United Kingdom, mounted with a 250 W output carbon dioxide laser, manufactured by Coherent Co., Ltd., USA).

D: Laser engraving was performed using a pulsed solid state laser "HIPPO-106Q" (tradename, manufactured by Spectra-Physics KK) as a laser light source. The repetition frequency, pulse width, and average output of the laser were 50 kHz, 15 nanoseconds, and 17 W, respectively. The power per pulse was 22.7 kW. The diameter of the laser beam was 8 μm (condensed with a lens).

(5) Viscosity, Thixotropy

The viscosity and thixotropy of the photosensitive resin composition were evaluated using a Brookfield viscometer. Selection of measuring equipment and measurement conditions, and meaning of symbols were according to the statement in the text of the present specification.

(6) Measurement of Shore A hardness

Measurement of Shore A hardness was performed using an automatic hardness meter manufactured by Zwick GmbH & Co. KG. (Germany). As a value of Shore A hardness, the value 15 seconds after the measurement was adopted.

(7) Shapability (Sheet Shape, Sleeve Shape)

The shapability was evaluated in accordance with the following criteria.

Good: It was possible to shape in a room temperature environment.

Poor: It was impossible to shape in a room temperature environment, or it was impossible to obtain a uniform coating in a room temperature environment (it was impossible to uniformly coat on a support with a doctor blade).

(8) Engraving Residue Cleanability

After laser engraving, cleaning was performed by using a steam jet (washer: tradename "HDS795" manufactured by Alfred Kaercher GmbH & Co. KG, cleaning conditions: preset temperature: 120° C., pressure: 5 MPa, about 5 seconds), wherein the time (second) taken to remove engraving residue was measured, and the cleanability was evaluated by the following criteria.

Excellent: The time taken to remove engraving residue is 5 seconds or less.

Good: The time taken to remove engraving residue exceeds 5 seconds and is 30 seconds or less.

Poor: The time taken to remove engraving residue exceeds 30 seconds.

(9) Engraving Surface Tackiness (N/m)

Engraving surface tackiness of the photosensitive resin cured product was measured by means of a tack tester manufactured by Toyo Seiki Seisaku-Sho Ltd. Specifically, an aluminum ring having a radius of 50 mm and a width of 13 mm was attached to a smooth portion of a test specimen at 20° C. A load of 0.5 kg was applied to the aluminum ring for 4 seconds. Subsequently, the aluminum ring was pulled at a rate of 30 mm per minute and the resisting force at the time of the detachment of the aluminum ring was measured by means of a push-pull gauge.

The larger the resisting force, the larger the surface tackiness.

Reference Example 1

A polyurethane having hydroxyl groups at both ends was synthesized by urethanation from a hydrogenated polybutadiene diol and tolylene diisocyanate, and then an unsaturated polyurethane was prepared in which methacryloxy isocyanate was added to both ends the polyurethane. The number average molecular weight of the synthesized unsaturated polyurethane (resin (a)-1) was about 20,000.

A precursor composition (i) was prepared according to the formulation shown in Table 1. The viscosity at 20° C. of the precursor composition (i) was 35 Pa·s.

Reference Example 2

To a separable flask (which had a capacity of 1 liter and was equipped with a thermometer, a stirrer and a reflux condenser) were added 508 g of a polyoxypropylene/polyoxyethylene block copolymer having a number average molecular weight of about 2,500 and 339 g of poly(3-methyl-1,5-pentanediol adipate) having a number average molecular weight of about 3,000, and 60.5 g of tolylene diisocyanate, and the resultant mixture was heated at 60° C. for approximately 3 hours to perform a reaction, thereby obtaining a reaction mixture. Subsequently, 40.6 g of 2-hydroxypropyl methacrylate and 50.1 g of polypropylene glycol monomethacrylate having a number average molecular weight of 380 were added to the obtained reaction mixture, and the reaction was further continued for 2 hours, thereby producing a resin (resin (a)-2) having terminal methacryl groups (the average number of polymerizable unsaturated groups per molecule was approximately 2) and having a number average molecular weight of approximately 22,500. The resin was a viscous fluid at 20° C., and it changed its shape in accordance with a force applied thereto and did not recover the original shape thereof after released from the force.

A precursor composition (ii) was prepared according to the formulation shown in Table 1. The viscosity at 20° C. of the precursor composition (ii) was 80 Pa·s.

Reference Example 3

A precursor composition (iii) was prepared according to the formulation shown in Table 1 using the resin (a)-1 obtained in substantially the same manner as in Reference Example 1. The viscosity at 20° C. of the precursor composition (iii) was 80 Pa·s.

Reference Example 4

To a separable flask (which had a capacity of 1 liter and was equipped with a thermometer, a stirrer and a reflux condenser) were added polycarbonate diol (tradename "PCDL L4672" manufactured by Asahi Kasei Chemicals Corporation, number average molecular weight: 1,990, OH value: 56.4) and tolylene diisocyanate, and the resultant mixture was heated at 80° C. for approximately 3 hours to perform a reaction, thereby synthesizing a polycarbonate polyurethane having hydroxyl groups at both ends. Subsequently, 2-methacryloyloxy isocyanate was allowed to react with the hydroxyl groups at both ends, thereby producing a resin (resin (a)-3) having terminal methacryl groups (the average number of polymerizable unsaturated groups per molecule was approximately 2) and having a number average molecular weight of approximately 10,000. The resin was a viscous fluid at 20° C., and it changed its shape in accordance with a force applied thereto and did not recover the original shape thereof after released from the force.

A precursor composition (iv) was prepared according to the formulation shown in Table 1. The viscosity at 20° C. of the precursor composition (iv) was 800 Pa·s.

Reference Example 5

To a separable flask (which had a capacity of 1 liter and was equipped with a thermometer, a stirrer and a reflux condenser) were added polycarbonate diol (tradename "PCDL L4672" manufactured by Asahi Kasei Chemicals Corporation, number average molecular weight: 1,990, OH value: 56.4) and 2-methacryloyloxy isocyanate, and the resultant mixture was heated at 80° C. for approximately 2 hours to perform a reaction, thereby producing a resin (resin (a)-4) having terminal methacryl groups (the average number of polymerizable unsaturated groups per molecule was approximately 2) and having a number average molecular weight of approximately 2,370. The resin was a viscous fluid at 20° C., and it changed its shape in accordance with a force applied thereto and did not recover the original shape thereof after released from the force.

A precursor composition (v) was prepared according to the formulation shown in Table 1. The viscosity at 20° C. of the precursor composition (v) was 388 Pa·s.

The formulations and the like for Reference Examples 1 to 5 as described above were summarized in Table 1.

TABLE 1

| | | | Formulation (parts by mass) Reference Example | | | | |
|---|---|---|---|---|---|---|---|
| | | Precursor composition | 1 (i) | 2 (ii) | 3 (iii) | 4 (iv) | 5 (v) |
| Resin (a) | Resin (a)-1 | Hydrogenated polybutane diol<br>Tolylene diisocyanate<br>Methacryloxy isocyanate<br>Mn = 20000 | 78 | | 65 | | |
| | Resin (a)-2 | Polyoxypropylene/polyoxyethylene block copolymer<br>Poly(3-methyl-1,5-pentanediol adipate)<br>Tolylene diisocyanate<br>2-Hydroxypropyl methacrylate<br>Polypropylene glycol monoacrylate<br>Mn = 22500 | | 65 | | | |
| | Resin (a)-3 | PCDLL4672 (Mn = 1990)<br>Tolylene diisocyanate<br>2-Methacryoyloxy isocyanate<br>Mn = 10000 | | | | 65 | |
| | Resin (a)-4 | PCDLL4672 (Mn1990)<br>Tolylene diisocyanate<br>2-Methacryoyloxy isocyanate<br>Mn = 2370 | | | | | 100 |
| Organic compound (c) | | Lauryl methacrylate (FW = 245) | 13 | 15 | | | |
| | | 1,3-Butylene glycol dimethacrylate (FW = 226) | 3 | 10 | | | |
| | | Polypropylene glycol dimethacrylate (FW = 660) | 3 | | | | |
| | | Diethylene glycol monobutyl ether monomethacrylate (FW = 230) | | | 15 | | |
| | | Trimethylolpropane trimethacrylate | | | | 2 | 2 |

TABLE 1-continued

| | Precursor composition | Formulation (parts by mass) Reference Example | | | | |
|---|---|---|---|---|---|---|
| | | 1 (i) | 2 (ii) | 3 (iii) | 4 (iv) | 5 (v) |
| | (FW338) Diethylene glycol-2-ethylhexyl ether acrylate (FW = 272) | | 10 | | | |
| | Phenoxy acrylate | | | | 33 | |
| Photopolymerization initiator | 2,2-Dimethoxy-2-phenylacetophenone | 0.6 | 0.6 | 0.6 | 0.6 | 2 |
| | Benzophenone | 1 | 1 | 1 | | 0.5 |
| Polymerization inhibitor | 2,6-di-t-butylacetophenone | 1 | 1 | 1 | 1 | 1 |
| Viscosity [Pa · s] (20° C.) | | 35 | 80 | 80 | 800 | 388 |

Example 1

A photosensitive resin composition was prepared according to the formulation shown in Table 2. The obtained photosensitive resin composition was shaped into a sheet (2.8 mm in thickness) on a PET film. The shaped resin article was photo-cured by means of an exposure apparatus (tradename "ALF type 213E" manufactured by Asahi Kasei Chemicals Corporation). The exposure was performed in the air, in which the upper surface of the sheet (on which a relief pattern was to be formed) was exposed at 2,000 mJ/cm$^2$ and the other surface of the sheet was exposed at 1,000 mJ/cm$^2$, thereby preparing a laser engravable sheet-shaped printing element (printing substrate). The light used for exposure was the light of an ultraviolet fluorescent lamp (chemical lamp, center wavelength: 370 nm) and a bactericidal lamp (germicidal lamp, center wavelength: 253 nm). The photosensitive resin composition was evaluated. The results are shown in Table 2.

Example 2

To an air cylinder having a diameter of 200 mm was fitted a 1.5 mm-thick sleeve having an inside diameter equal to the diameter made from a fiberglass reinforced plastic. Next, the photosensitive resin composition in Example 1 was coated on the sleeve using a doctor blade while rotating, the air cylinder (3 mm in thickness). Then, the light of a chemical lamp (center wavelength: 370 nm) and a bactericidal lamp (center wavelength: 253 nm) were irradiated at 2,000 mJ/cm$^2$ and 500 mJ/cm$^2$, respectively, while rotating the air cylinder in the atmospheric air, thereby forming a 3 mm-thick sleeve-shaped (cylindrical) printing element. The obtained printing element (photosensitive resin cured product) had been completely cured from the surface to the inside thereof. Note that the photosensitive resin composition did not drip with gravity while being shaped into a cylinder. A sleeve-shaped printing element was easily shaped. The photosensitive resin composition and the printing element were evaluated. The results are shown in Table 2.

Examples 3 to 5

Photosensitive resin compositions were prepared according to the formulations shown in Table 2. The obtained photosensitive resin compositions were measured for the viscosity thereof, wherein the viscosity was reduced as the rotational speed of the rotor of a Brookfield viscometer was increased. Laser engravable sheet-shaped printing elements were prepared in substantially the same manner as in Example 1 using the obtained photosensitive resin compositions. The photosensitive resin compositions and the printing elements were evaluated. The results are shown in Table 2. It was possible to obtain a beautiful printing plate surface by steam cleaning after the laser engraving.

Example 6

A photosensitive resin composition was prepared according to the formulation shown in Table 2. The obtained photosensitive resin composition was shaped into a sheet (0.5 mm in thickness) on a PET film. The sheet was covered with a 15 μm-thick PET cover film and irradiated with the light from a high-pressure mercury-vapor lamp in the air to form a laser engraving printing element layer. The amount of energy irradiated was 4,000 mJ/cm$^2$. The amount of irradiated energy is the value which was subjected to time quadrature of the illumination measured by means of a "UV-35-APR filter" (tradename, manufactured by ORC Manufacturing Co., Ltd.).

Further, the photosensitive resin composition was separately shaped on a PET film into a sheet (50 μm in thickness). The sheet was covered with a 15 μm-thick PET cover film and irradiated with the light from a high-pressure mercury-vapor lamp in the air to obtain a sample for measuring light transmittance. The amount of energy irradiated was 2,000 mJ/cm$^2$. The amount of irradiated energy was measured in substantially the same manner as described above.

The sample for measuring light transmittance was measured for light transmittance by means of an ultraviolet/visible/near-infrared spectrophotometer "V-570" (tradename, manufactured by Jasco Corporation). The light transmittance at a wavelength of 365 nm was 59%. In addition, the light transmittance at a wavelength of 1,064 nm which is an oscillation wavelength of a near-infrared laser was 91%.

[Production of a Printing Element]

A cushion tape (tradename "1820" manufactured by 3M Company) was stuck on the surface of a 200 μm-thick polyester film (PET). A release paper on the surface was peeled to expose the adhesive layer.

The PET films laminated on both sides of the above laser engraving printing element layer were removed, and the printing element layer was stuck to the above cushion layer via a double-sided adhesive tape to form a sheet-shaped printing element in which the laser engraving layer was laminated on the cushion layer.

The B method as described above was used as the laser engraving method. Precise patterns were formed first. The laser beam was fixed; the sample (sheet-shaped printing element) to be engraved was fixed; and the XY stage was moved, thereby forming a plurality of line-shaped relief patterns which are orthogonal to each other. The $M^2$ value which shows the quality of the beam was less than 1.2. The region in which the line-shaped relief patterns were formed was 50 mm×50 mm. In this region, 30 line-shaped relief patterns each having a width of 8 μm and a length of 40 mm were engraved at equal intervals, and 30 line-shaped relief patterns each having a width of 8 μm and a length of 40 mm which were orthogonal to the above line-shaped relief patterns were engraved at equal intervals. The XY stage driven by a stepping motor was moved at a speed of 5 mm/second. The depth of the obtained line-shaped relief patterns was 20 μm. A depth of 20 μm was engraved by 80 pulses, which means that the engraving depth per pulse was 0.25 μm. The edge of the obtained pattern was clear.

Further, the sheet-shaped printing plate on which the precise relief patterns are formed were wound on a cylinder to form coarse patterns. Tapered groove patterns each having a width of 5 mm and a depth of 300 μm were formed outside the 50 mm×50 mm region in which precise relief patterns were formed.

The sheet-shaped printing plate on which the relief patterns were formed as described above was installed in a precision printing machine "JSC-m4050-M" (tradename, manufactured by Nihon Denshi Seiki Co., Ltd.) of a flexographic printing specification. Printing was performed on a glass substrate. It was possible to print reverse lines corresponding to the relief patterns under a proper printing pressure.

Example 7

A photosensitive resin composition was prepared according to the formulation shown in Table 2. Subsequently, a sheet-shaped printing element was formed in substantially the same manner as in Example 6. The photosensitive resin composition and the printing element were evaluated. The results are shown in Table 2.

The C method as described above was used as the laser engraving method. The sample was fixed and the laser beam was scanned in the XY direction using a galvanomirror, thereby forming relief patterns. The $M^2$ value which shows the quality of the beam was less than 1.8. Line-shaped relief patterns were formed according to the same design as in Example 1. The obtained relief patterns were 10 μm in width and 25 μm in depth. The engraving depth per pulse was 0.3 μm. The edge of the obtained patterns was clear.

Example 8

A photosensitive resin composition was prepared according to the formulation shown in Table 2. A sheet-shaped printing plate was formed in substantially the same manner as in Example 6 except that the thickness was 0.15 mm. The photosensitive resin composition and the printing element were evaluated. The results are shown in Table 2.

The light transmittance (wavelength: 365 nm) of a sample for measuring light transmittance created in substantially the same manner as in Example 6 was 10%. In addition, the light transmittance at a wavelength of 1,064 nm which is an oscillation wavelength of a near-infrared laser was 51%. The size of the relief patterns formed using a pulsed ultraviolet laser was 12 μm in width and 10 μm in depth. The edge of the obtained patterns was clear.

Example 9

A sheet-shaped printing plate provided with relief patterns was created in substantially the same manner as in Example 6 except that the D method as described above was used as the laser engraving method. The photosensitive resin composition and the printing element were evaluated. The results are shown in Table 2. The width of the obtained relief patterns was 30 μm, which was larger than the beam diameter. In addition, the depth of the patterns was 40 μm.

Examples 10 to 12

Photosensitive resin compositions were prepared according to the formulations shown in Table 2. The obtained photosensitive resin compositions were used to create laser engravable sheet-shaped printing elements in substantially the same manner as in Example 1. The photosensitive resin compositions and the printing elements were evaluated. The results are shown in Table 2. On the printing plate surfaces after laser engraving, some liquid debris and carbide remained in addition to powdered debris. However, it was possible to remove these engraving debris by steam cleaning.

Example 13

Photosensitive resin composition was prepared according to the formulation shown in Table 2. The obtained photosensitive resin composition was shaped into a sheet (2 mm in thickness) on a PET film. The sheet was irradiated with the light from a high-pressure mercury-vapor lamp in the air to form a laser engravable sheet-shaped printing element layer. The photosensitive resin composition and the printing element were evaluated. The results are shown in Table 2. The amount of energy irradiated was 4,000 mJ/cm$^2$. Note that the amount of irradiated energy is the value which was subjected to time quadrature of the illumination measured by means of a "UV-35-APR filter" (tradename, manufactured by ORC Manufacturing Co., Ltd.). The Shore A hardness of the obtained printing element layer was 84 degrees.

Although generation of liquid debris was not observed on the printing plate surface after laser engraving, a powder which was a little viscous was present thereon. It was possible to obtain a beautiful printing plate surface by performing steam cleaning.

Comparative Examples 1 and 2

As shown in Table 2, sheet-shaped printing elements were formed in substantially the same manner as in Example 1 using a precursor composition (i) or (ii). The photosensitive resin compositions and the printing elements were evaluated. The results are shown in Table 2. When these printing elements were subjected to laser engraving, a large amount of liquid debris was generated and adhered also to the condenser lens of the laser, and sticking occurred on the lens surface. In addition, there was present a portion from which debris in halftone dots cannot be removed after steam cleaning.

Comparative Examples 3 and 4

Photosensitive resin compositions were prepared according to the formulations shown in Table 2. The photosensitive resin compositions were evaluated. The results are shown in Table 2. The viscosity at 20° C. significantly exceeded 10 kPa·s. It was impossible to shape a sheet in a room temperature environment (Comparative Example 3), or it was impossible to obtain a uniform coating in a room temperature environment (Comparative Example 4).

Comparative Example 5

A photosensitive resin composition was prepared according to the formulation shown in Table 2. A sheet-shaped printing element was formed in substantially the same manner as in Example 1. The photosensitive resin composition and the printing element were evaluated. The results are shown in Table 2. When this printing element was subjected to laser engraving, liquid engraving debris was generated.

TABLE 2

|  |  |  | Example |  |  |  |  |  |  |  |  |
|---|---|---|---|---|---|---|---|---|---|---|---|
|  |  |  | 1 | 2 | 3 | 4 | 5 | 6 | 7 | 8 | 9 |
| Precursor composition (i) |  |  | 100 | 100 |  |  | 100 | 100 | 100 | 100 | 100 |
| Precursor composition (ii) |  |  |  |  | 100 |  |  |  |  |  |  |
| Precursor composition (iii) |  |  |  |  |  | 100 |  |  |  |  |  |
| Precursor composition (iv) |  |  |  |  |  |  |  |  |  |  |  |
| Precursor composition (v) |  |  |  |  |  |  |  |  |  |  |  |
| Inorganic microparticles (b) | AEROSIL 200 (hydrophilic) |  | 2 | 2 | 2 | 3 |  | 2 | 2 | 2 | 2 |
|  | AEROXIDE AluC (hydrophilic) |  |  |  |  |  | 1 |  |  |  |  |
|  | AEROSIL RX200 (hydrophobic) |  |  |  |  |  |  |  |  |  |  |
|  | AEROSIL R974 (hydrophobic) |  |  |  |  |  |  |  |  |  |  |
|  | AEROSIL RY200 (hydrophobic) |  |  |  |  |  |  |  |  |  |  |
|  | Zirconium silicate |  |  |  |  |  |  |  |  |  |  |
| Dispersant | OX-20 |  |  |  |  | 0.2 |  |  |  |  |  |
| Phthalocyanine dye |  |  |  |  |  |  |  | 0.02 | 0.02 | 2500 ppm | 0.02 |
| Evaluations of photosensitive resin composition | Viscosity [Pa · s] (20° C.) |  | 200 | 200 | 400 | 300 | — | — | — | — | — |
|  | Thixotropy | Rotor number | 6 | 6 | — | — | — | — | — | — | — |
|  |  | $R_0$ (revolution/min) | 2.5 | 2.5 | — | — | — | — | — | — | — |
|  |  | $\eta_0$ | 200 | 200 | — | — | — | — | — | — | — |
|  |  | $\eta_1$ | 70 | 70 | — | — | — | — | — | — | — |
|  |  | $\eta_1/\eta_0$ | 0.35 | 0.35 | — | — | — | — | — | — | — |
|  | Shapability (sheet shape) |  | Good | — | Good | Good | Good | Good | Good | Good | Good |
|  | Shapability (sleeve shape) |  | — | Good | — | — | — | — | — | — | — |
| Evaluation of printing element | Sheet shape | Engraving residue cleanability | — | — | Excellent | Excellent | Excellent | Excellent | Excellent | Excellent | Excellent |
|  |  | Engraving surface tackiness (N/m) | — | — | 100> | — | — | — | — | — | — |
|  | Sleeve shape | Engraving residue cleanability | — | Excellent | — | — | — | — | — | — | — |
|  |  | Engraving surface tackiness (N/m) | — | 100> | — | — | — | — | — | — | — |
|  | Laser engraving method |  | — | A | A | A | A | B | C | B | D |

|  |  |  | Example |  |  |  | Comparative Example |  |  |  |  |
|---|---|---|---|---|---|---|---|---|---|---|---|
|  |  |  | 10 | 11 | 12 | 13 | 1 | 2 | 3 | 4 | 5 |
| Precursor composition (i) |  |  | 100 | 100 | 100 |  | 100 |  | 100 |  | 100 |
| Precursor composition (ii) |  |  |  |  |  |  |  | 100 |  |  |  |
| Precursor composition (iii) |  |  |  |  |  |  |  |  |  |  |  |
| Precursor composition (iv) |  |  |  |  |  |  |  |  |  | 100 |  |
| Precursor composition (v) |  |  |  |  |  | 100 |  |  |  |  |  |
| Inorganic microparticles (b) | AEROSIL 200 (hydrophilic) |  |  |  |  | 2 |  |  | 15 | 2 |  |
|  | AEROXIDE AluC (hydrophilic) |  |  |  |  |  |  |  |  |  |  |
|  | AEROSIL RX200 (hydrophobic) |  | 2 |  |  |  |  |  |  |  |  |
|  | AEROSIL R974 (hydrophobic) |  |  | 2 |  |  |  |  |  |  |  |
|  | AEROSIL RY200 (hydrophobic) |  |  |  | 2 |  |  |  |  |  |  |
|  | Zirconium silicate |  |  |  |  |  |  |  |  |  | 2 |
| Dispersant | OX-20 |  |  |  |  |  |  |  |  |  |  |
| Phthalocyanine dye |  |  |  |  |  |  |  |  |  |  |  |
| Evaluations of photosensitive resin composition | Viscosity [Pa · s] (20° C.) |  | 30 | 60 | 45 | — | — | — | 10000< | 10000< | 50 |
|  | Thixotropy | Rotor number | 5 | 6 | 5 | 7 | — | — | — | — | — |
|  |  | $R_0$ (revolution/min) | 5 | 5 | 5 | 1 | — | — | — | — | — |
|  |  | $\eta_0$ | 30 | 60 | 45 | 1500 | — | — | — | — | — |
|  |  | $\eta_1$ | 26 | 40 | 35 | 600 | — | — | — | — | — |
|  |  | $\eta_1/\eta_0$ | 0.88 | 0.67 | 0.78 | 0.40 | — | — | — | — | — |

TABLE 2-continued

|  |  |  |  |  |  |  |  |  |  |  |
|---|---|---|---|---|---|---|---|---|---|---|
|  | Shapability (sheet shape) |  | Good | Good | Good | Good | Good | Good | Poor | — | Good |
|  | Shapability (sleeve shape) |  | — | — | — | — | — | — | — | Poor | — |
| Evaluation of printing element | Sheet shape | Engraving residue cleanability | Good | Good | Good | Good | Poor | Poor | — | — | Poor |
|  |  | Engraving surface tackiness (N/m) | — | — | — | — | 300< | 300< | — | — | 500< |
|  | Sleeve shape | Engraving residue cleanability | — | — | — | — | — | — | — | — | — |
|  |  | Engraving surface tackiness (N/m) | — | — | — | — | — | — | — | — | — |
|  | Laser engraving method |  | A | A | A | A | A | A | — | — | A |

[AEROSIL 200]

Dry type (flame hydrolysis) silica, manufactured by Japan Aerosil Co., Ltd. As a result of observation with a transmission electron microscope, the number average particle diameter was about 12 nm; the specific surface area was 200 m$^2$/g; and the shape of the primary particles was spherical. In addition, the pore volume was less than 0.1 ml/g. The density of the surface hydroxy groups determined by a lithium aluminum hydride method was 2.5 pieces/nm$^2$.

[AEROXIDE AluC]

Ultrafine particle alumina, manufactured by Japan Aerosil Co., Ltd. The number average particle diameter of the primary particles was about 13 μm; the specific surface area was about 100 m$^2$/g; and the shape of the primary particles was spherical. In addition, the pore volume was less than 0.1 ml/g. The ultrafine particle alumina is estimated to be hydrophilic microparticles because it was dispersible in water when it was used.

[AEROSIL RX200]

Hydrophobic silica, manufactured by Japan Aerosil Co., Ltd. A $^{29}$Si—NMR measurement showed that a trimethylsilyl group was present on the surface. When it was added to water, it was observed to float on the water surface. The density of the surface hydroxy groups determined by a lithium aluminum hydride method was less than 1 piece/nm$^2$. Further, the primary particles of AEROSIL RX200 had a number average particle diameter of about 12 nm and a specific surface area of 140 m$^2$/g.

[AEROSIL R974]

Hydrophobic silica, manufactured by Japan Aerosil Co., Ltd. A $^{29}$Si—NMR measurement showed that a dimethylsilyl group was present on the surface. When it was added to water, it was observed to float on the water surface. The density of the surface hydroxy groups determined by a lithium aluminum hydride method was about 0.4 piece/nm$^2$. Further, the primary particles of AEROSIL R974 had a number average particle diameter of about 12 nm and a specific surface area of 170 m$^2$/g.

[AEROSIL RY200]

Hydrophobic silica, manufactured by Japan Aerosil Co., Ltd. A $^{29}$Si-NMR measurement showed that trimethylsilyl silicone was present on the surface. When it was added to water, it was observed to float on the water surface. Further, the primary particles of AEROSIL RY200 had a number average particle diameter of about 12 nm and a specific surface area of 100 m2/g.

[Zirconium Silicate]

Manufactured by Sigma-Aldrich Corp., USA. Particles having a number average particle diameter of about 800 nm were used, which were obtained by classifying a 325-mesh article to remove a portion having a large particle diameter. Further, the zirconium silicate used had a pore volume as measured by a nitrogen absorption method of 0.026 ml/g.

Polyoxyethylene synthetic alcohol ether, manufactured by Aoki Oil Industrial Co., Ltd.

[Phthalocyanine Dye]

Phthalocyanine-based dye whose central metal is vanadium.

The following points can be read in the results of Table 2.

(1) Each photosensitive resin composition of the present embodiment had a suitable viscosity range, and its shapability was good. The engraving residue cleanability after laser engraving was also good.

(2) Efficiency in removing liquid debris generated at the time of laser engraving was improved particularly by using hydrophilic ultrafine particles. Further, by using the hydrophilic ultrafine particles, the thixotropy of the photosensitive resin composition was improved to suppress the dripping, which was effective particularly in securing the shapability on a cylindrical support.

(3) It was verified that it was possible to engrave precise patterns with a pulsed near-infrared laser having a low average output by using inorganic ultrafine particles and near-infrared absorption dyes together.

INDUSTRIAL APPLICABILITY

The photosensitive resin composition of the present invention is suitable as a laser engravable liquid photosensitive resin composition for printing materials in which the efficiency in removing debris generated at the time of laser engraving is improved and which can be easily shaped.

The invention claimed is:

1. A photosensitive resin composition, characterized by comprising:
   (a) 100 parts by mass of a resin having a number average molecular weight of 1,000 or more; and
   (b) 0.1 to 10 parts by mass of ultrafine hydrophilic particles having a number average particle diameter of primary particles of 5 nm or more and 100 nm or less and having a silanol group density of 1 piece/nm$^2$ or more; component (b) is dispersible in water; wherein the photosensitive resin composition has a viscosity at 20° C. of 50

Pa·s or more and 10,000 Pa·s or less; and a precursor composition which is obtained by excluding the component (b) from the photosensitive resin composition has a viscosity at 20° C. of 5 Pa·s or more and 500 Pa·s or less.

2. The photosensitive resin composition according to claim 1, further comprising: (c) 5 to 200 parts by mass of an organic compound which has a number average molecular weight of 100 or more and less than 1,000 and has a polymerizable unsaturated group in the molecule thereof.

3. The photosensitive resin composition according to claim 1 or 2, wherein the primary particles of the component (b) each have a spherical shape.

4. The photosensitive resin composition according to claim 1 or 2, wherein the component (b) is a nonporous ultrafine particle produced by any of flame hydrolysis, an arc process, a plasma process, a precipitation method, a gelling method, or a fused solid method; and
  wherein the nonporous ultrafine particle is a nonporous particle composed, as a main component, of at least one selected from the group consisting of alumina, silica, zirconium oxide, barium titanate, strontium titanate, titanium oxide, silicon nitride, boron nitride, silicon carbide, chrome oxide, vanadium oxide, tin oxide, chrome oxide, vanadium oxide, tin oxide, bismuth oxide, germanium oxide, aluminum borate, nickel oxide molybdenum oxide, tungsten oxide, iron oxide, and cerium oxide.

5. The photosensitive resin composition according to claim 1 or 2, wherein the component (a) has a hydrogen-bonding functional group in the molecule thereof.

6. The photosensitive resin composition according to claim 1 or 2, wherein the component (a) has at least one bond selected from the group consisting of a carbonate bond, an amide bond, an ester bond, and an imide bond; or the component (a) has at least one molecular chain selected from the group consisting of an aliphatic hydrocarbon chain and an alicyclic hydrocarbon chain and has a urethane bond.

7. The photosensitive resin composition according to claim 1 or 2, wherein the component (b) has a specific surface area of 10 $m^2$/g or more and 1,000 $m^2$/g or less.

8. The photosensitive resin composition according to claim 1 or 2, wherein the composition has thixotropy.

9. The photosensitive resin composition according to claim 2, wherein the component (b) is micro-dispersed in the component (c), wherein the micro-dispersion treatment is at least one method selected form the group consisting of an ultrasonic dispersion method, a high-speed agitation and dispersion method, a high-speed shear dispersion method, and a bead mill dispersion method.

10. The photosensitive resin composition according to claim 1 or 2, further comprising component (d):
  d) 0.01 to 5 parts by mass of a nonionic surfactant having a hydrogen-bonding functional group.

* * * * *